United States Patent
Kwak et al.

(10) Patent No.: US 7,629,819 B2
(45) Date of Patent: Dec. 8, 2009

(54) SEAMLESS COARSE AND FINE DELAY STRUCTURE FOR HIGH PERFORMANCE DLL

(75) Inventors: Jongtae Kwak, Boise, ID (US); Kang Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 277 days.

(21) Appl. No.: 11/186,548

(22) Filed: Jul. 21, 2005

(65) Prior Publication Data

US 2007/0030753 A1   Feb. 8, 2007

(51) Int. Cl.
*H03L 7/06* (2006.01)
*H03K 5/14* (2006.01)

(52) U.S. Cl. .................. 327/158; 327/241; 327/244; 327/272

(58) Field of Classification Search .................. None
See application file for complete search history.

(56) References Cited

U.S. PATENT DOCUMENTS

| | | | |
|---|---|---|---|
| 6,060,928 A | 5/2000 | Jun et al. | |
| 6,100,735 A | 8/2000 | Lu | |
| 6,313,675 B1 | 11/2001 | Naffziger | |
| 6,546,530 B1 | 4/2003 | Dreps et al. | |
| 6,573,771 B2 * | 6/2003 | Lee et al. | 327/158 |
| 6,661,265 B2 * | 12/2003 | Partsch et al. | 327/158 |
| 6,765,976 B1 | 7/2004 | Oh | |
| 6,768,361 B2 | 7/2004 | Kwak | |
| 6,774,691 B2 * | 8/2004 | Han et al. | 327/158 |
| 6,795,931 B1 | 9/2004 | LaBerge | |
| 6,826,247 B1 | 11/2004 | Elliott et al. | |
| 6,868,504 B1 | 3/2005 | Lin | |
| 7,046,059 B2 * | 5/2006 | Kwak | 327/158 |
| 7,088,159 B2 * | 8/2006 | Kwak et al. | 327/161 |

\* cited by examiner

*Primary Examiner*—Lincoln Donovan
*Assistant Examiner*—Terry L Englund
(74) *Attorney, Agent, or Firm*—Jones Day; Edward L. Pencoske

(57) ABSTRACT

A clock synchronization system and method avoids output clock jitter at high frequencies and also achieves a smooth phase transition at the boundary of the coarse and fine delays. The system may use a single coarse delay line configured to generate two intermediate clocks from the input reference clock and having a fixed phase difference therebetween. The coarse delay line may have a hierarchical or a non-hierarchical structure. A phase mixer receives these two intermediate clocks and generates the final output clock having a phase between the phases of the intermediate clocks. The coarse shifting in the delay line at high clock frequencies does not affect the phase relationship between the intermediate clocks fed into the phase mixer. The output clock from the phase mixer is time synchronized with the input reference clock and does not exhibit any jitter or noise even at high clock frequency inputs.

43 Claims, 12 Drawing Sheets

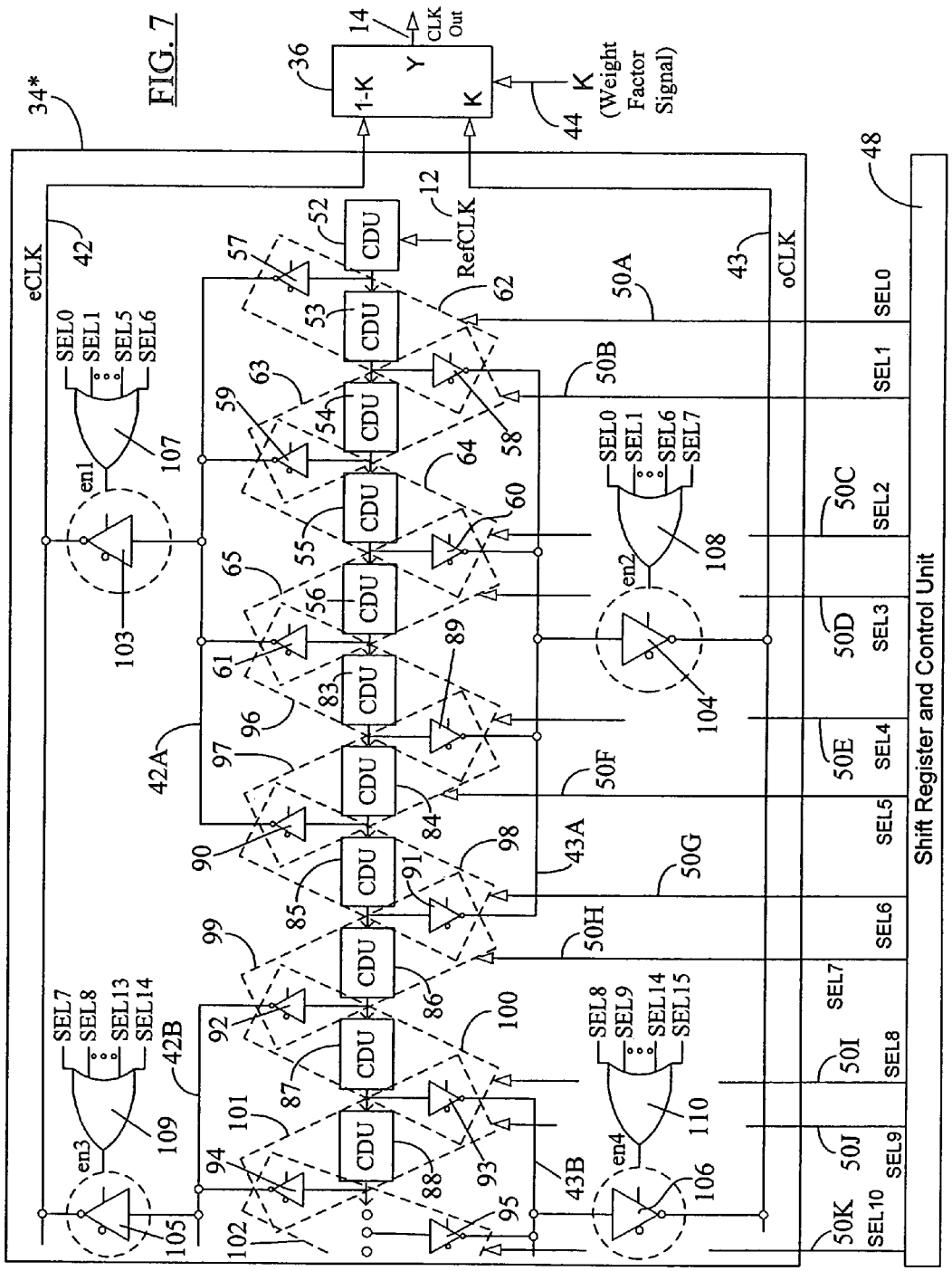

SEAMLESS COARSE AND FINE DELAY STRUCTURE FOR HIGH PERFORMANCE DLL

BACKGROUND

1. Field of the Disclosure

The present disclosure generally relates to synchronous circuits and, more particularly, to a single delay line based structure to provide for a seamless phase change between coarse and fine delays at high frequencies.

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the flow of commands, data, addresses, etc., into, through and out of the devices.

In SDRAMs or other semiconductor memory devices, it is desirable to have the data output from the memory synchronized with the system clock that also serves the microprocessor. Delay-locked loops (DLLs) are synchronous circuits used in SDRAMs to synchronize an external clock (e.g., the system clock serving a microprocessor) and an internal clock (e.g., the clock used internally within the SDRAM to perform data read/write operations on various memory cells) with each other. Typically, a DLL is a feedback circuit that operates to feed back a phase difference-related signal to control a delay line, until the timing of one clock signal (e.g., the system clock) is advanced or delayed until its rising edge is coincident (or "locked") with the rising edge of a second clock signal (e.g., the memory internal clock).

FIG. 1 depicts a simplified block diagram of a delay-locked loop (DLL) 10. The DLL 10 receives a reference clock (RefClk) 12 as an input and generates an output clock or the ClkOut signal 14 at its output. The ClkOut signal 14 is, in turn, fed back as a feedback clock (ClkFB or FBClock) 16 as discussed later. The reference clock 12 is interchangeably referred to herein as "ClkREF", "RefClk", "Ref clock signal" or "Ref clock"; whereas the feedback clock 16 is interchangeably referred to herein as "ClkFB", "ClkFB signal", "FB clock signal" or "FBClock." The reference clock 12 is typically the external system clock serving the microprocessor or a delayed/buffered version of it. The system clock 12 may be supplied to the DLL 10 via one or more clock buffers (not shown).

The delay line in the DLL 10 may be comprised of a coarse delay line 18 and a fine delay line 20. The RefClk 12 may be supplied first to the coarse delay line 18 whose output is then fed into the fine delay line 20 to generate the ClkOut signal 14. The coarse delay line 18 may include a number of coarse delay stages (not shown) and may be designed to produce an output signal having a phase variation from an input signal within a coarse delay stage, whereas the fine delay line 20 is typically designed to produce an output signal having a phase variation from the input signal which is substantially smaller than the deviation provided by the coarse delay line 18. In other words, the coarse delay line 18 is designed to bring its output signal to a near phase lock condition, or phase delayed condition, whereas the fine delay line 20 is designed to perform "fine tuning" to achieve the signal locking condition. Thus, a dual delay line (coarse and fine) DLL or PLL can provide a wide lock range while at the same time still providing a tight lock within reasonable time parameters.

In operation, the clock output signal 14 is used to provide the internal clock (not shown) used, for example, by a memory device (not shown) to perform data read/write operations on memory cells (not shown) and to transfer the data out of the memory device to the data requesting device (e.g., a microprocessor (not shown)). As can be seen from FIG. 1, the ClkOut signal 14 (and, hence, the FBClock 16) is generated using delay lines 18, 20, which introduce a specific delay into the input Ref clock 12 to obtain the "lock" condition.

As noted before, the purpose of the DLL 10 is to align or lock the internal clock (not shown) used by, for example, a memory device to perform data read/write operations to the system's external clock (not shown). A delay monitor 22 monitors a delay time of the output clock 14 from the coarse and fine delay lines 18, 20. A phase detector (PD) 24 compares the relative timing of the edges of the system's external clock (not shown) and the memory's internal clock (not shown) by comparing the relative timing of their respective representative signals—the Ref clock 12 which relates to the system clock, and the FBClock signal 16 which relates to the memory's internal clock—so as to establish the lock condition. The PD 24 may compare a phase difference between the RefClk 12 and the FBClock 16 (supplied via the delay monitor 22) and output appropriate shift signals SHL (Shift Left) signal 25 and SHR (Shift Right) signal 26 for adjusting the phase difference between the RefClk 12 and the ClkOut 14. The delay monitor circuit 22 may function as a buffer or dummy delay circuit for the ClkOut signal 14 before the ClkOut signal 14 is fed into the phase detector 24 as the FB clock 16. The output of the delay monitor 22 (i.e., the FB clock 16) may effectively represent the memory's internal clock, which may be provided to various circuit elements in a memory device through the clock driver and data output stages (not shown). Thus, the delay monitor 22 attempts to maintain the phase relationship between the Ref clock 12 and the FB clock 16 as close as possible to the phase relationship that exists between the external system clock (not shown) and the electronic device's (e.g., a memory's) internal clock (not shown).

The Ref clock 12 and the FB clock 16 are fed as inputs into the phase detector 24 for phase comparison. The output of the PD 24—one of the SHL 25 and SHR 26 signals—controls the amount of delay imparted to the RefClk 12 by the delay lines 18, 20. The SHL 25 and SHR 26 signals may determine whether the Ref clock 12 should be shifted left (SHL) or shifted right (SHR) through the appropriate delay units in the delay lines 18, 20 so as to match the phases of the Ref clock 12 and the FB clock 16 to establish the lock condition. The SHL 25 and SHR 26 signals may be supplied to the delay lines 18, 20 via a shift register 28, which may control the delay time of the delay lines 18, 20 according to the shift signals SHL and SHR from the phase detector 24. Based on the status of the SHL 25 and SHR 26 signals input thereto, the shift register 28 may generate one or more delay adjustment signals 30 to carry out the left or right shift operations indicated by the phase detector 24 (via SHL 25 or SHR 26 signals). As is known in the art, a shift left operation in a delay line results in adding a delay to the clock signal input thereto, whereas a shift right operation reduces the delay. The delay adjustment signals 30 essentially serve the same purpose as the SHL 25 or the SHR 26 signals, but their application to the coarse and fine delay lines 18, 20, respectively, is controlled by the shift register 28. The cumulative delay imparted to the Ref clock 12 by the series-connected coarse and fine delay lines 18 and 20, respectively, operates to adjust the time difference between the output clock 14 (as represented by the FB clock 16) and the input RefClk 12 until they are aligned. The phase detector 24 generates the shift left (SHL) and shift right (SHR) signals depending on the detected phase difference or timing difference between the Ref clock 12 and the FB clock 16, as is known in the art.

In the DLL 10 of FIG. 1, when the RefClk 12 is output from the coarse delay line 18 and input to the fine delay line 20, the switching at the boundary of coarse and fine delays may result in creation of jitter(s) or discontinuity in the final signal output from the fine delay line 20 (i.e., the ClkOut signal 14). These clock perturbations may not be desirable, especially when an electronic device (e.g., a memory device (not shown)) is operated at significantly high clock frequencies (e.g., 800 MHz or higher). Furthermore, as reference clock frequencies increase, the DLL architecture in FIG. 1 may not be suitable to adequately control coarse shifting at such high frequencies, which may negatively affect the signal integrity of the output clock 14 and may also delay establishment of a lock condition.

It is therefore desirable to devise a clock synchronization circuit that avoids output clock signal jitter at high clock frequencies and that also performs a smooth phase transition at the boundary of the coarse and fine delays. It is also desirable to have this synchronization circuit able to adequately control coarse shifting at higher clock frequencies without any limitations.

SUMMARY

In one embodiment, the present disclosure contemplates a method of producing a clock signal for a fine delay line from a coarse delay line. The method comprises applying a reference clock to a first delay unit in the single, coarse delay line, wherein the delay line includes a plurality of delay units. A first intermediate clock and a second intermediate clock are generated from the reference clock using the single delay line, wherein the first and the second intermediate clocks have a fixed phase difference therebetween. An output clock is generated from the first and second intermediate clocks, wherein the output clock has a phase between the phases of the first and second intermediate clocks.

In another embodiment, the present disclosure contemplates a method of producing a clock signal for a fine delay line from a single, coarse delay line formed by a chain of serially connected delay units with a tri-state inverter positioned at the output of each delay unit in the chain of delay units. The method is comprised of applying a reference clock to a first delay unit in the coarse delay line. Starting with a pair of delay units that includes the first delay unit, selectively activating two or more delay units and each tri-state inverter connected to an input and an output, respectively, of the most-recently activated delay unit in the two or more delay units based on a delay determination by a phase detector. The outputs of at least certain of the even-numbered tri-state inverters in the delay line are combined to generate a first intermediate clock and the outputs of at least certain of the odd-numbered tri-state inverters in the delay line are combined to generate a second intermediate clock, wherein the first and the second intermediate clocks have a fixed phase difference therebetween. An output clock is generated from the first and the second intermediate clocks, wherein the output clock has a phase between the phases of the first and said second intermediate clocks.

In a further embodiment, the present disclosure contemplates a method of operating a synchronization circuit having a single, coarse delay line with a plurality of delay units. The method comprises applying a reference clock to a first delay unit in the single, coarse delay line which is comprised of a plurality of delay units. A first intermediate clock and a second intermediate clock are generated from the reference clock using the single, coarse delay line, wherein the first and said second intermediate clocks have a fixed phase difference therebetween. An output clock is generated from the first and the second intermediate clocks, wherein the output clock has a phase between the phases of the first and the second intermediate clocks. The output clock may be used as a feedback signal to control the number of delay units that are active in the coarse delay line.

In a still further embodiment, the present disclosure contemplates a clock synchronization circuit. The circuit comprises a single delay line to receive a reference clock and to generate a first intermediate clock and a second intermediate clock therefrom. The first and the second intermediate clocks have a fixed phase difference therebetween. The synchronization circuit also includes a phase mixer coupled to the delay line to receive the first and the second intermediate clocks as inputs thereto and to generate an output clock as an output therefrom, wherein the output clock has a phase between the phases of the first and the second intermediate clocks. The output clock is used by a feedback loop for controlling the coarse delay line and phase mixer.

The clock synchronization circuit according to the present disclosure may be part of an electronic device including, for example, a memory device. Such memory devices may be used in various systems including, for example, computing or data processing systems. Such electronic devices and systems are also contemplated in various embodiments of the present disclosure.

The systems and methods of the present disclosure avoid output clock jitter at high frequencies and achieve a smooth phase transition at the boundary of the coarse and fine delays. The system may use a single coarse delay line configured to generate two intermediate clocks having a fixed phase difference therebetween from the input reference clock. The coarse delay line may have a hierarchical or a non-hierarchical structure. A phase mixer receives these two intermediate clocks and generates the final output clock having a phase between the phases of the intermediate clocks. The coarse shifting in the delay line at high clock frequencies does not affect the phase relationship between the intermediate clocks fed into the phase mixer. Thus, the phase mixer receives the intermediate clocks with a fixed phase delay at all times, regardless of coarse shifting performed in the coarse delay line. Therefore, although a phase mixer may solve the delay discontinuity problem between the coarse and fine delay boundary, the generation of the intermediate signals using a single delay line further allows coarse shifting at high frequencies, without any limitations. The output clock from the phase mixer is time synchronized with the input reference clock and does not exhibit any jitter or noise even at high clock frequency inputs.

BRIEF DESCRIPTION OF THE DRAWINGS

For the present disclosure to be easily understood and readily practiced, the present disclosure will now be described for purposes of illustration and not limitation, in connection with the following figures, wherein:

FIG. 7 illustrates another exemplary architecture according to one embodiment of the present disclosure for the coarse and fine delay lines in the synchronization circuit of FIG. 2;

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state memories or memory-based systems. It is noted at the outset that the terms "coupled," "connected", "connecting," "electrically connected," etc., are used interchangeably herein to generally refer to the condition of being electrically connected. It is further noted that various block diagrams, circuit diagrams and timing waveforms shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

It is noted here at the outset that the terms "synchronous circuit" or "synchronization circuit" are used interchangeably hereinbelow to refer to a clock synchronization circuit such as a delay locked loop (DLL) or a phase locked loop (PLL). As mentioned hereinbefore, it is known in the art that a clock synchronization circuit is used for compensating a skew between an external clock signal and an internal clock signal for an electronic device, e.g., a memory device. It is further noted here that although the discussion below is given with reference to a delay locked loop (DLL), that discussion may equally apply (with necessary circuit modifications known to one skilled in the art) to a circuit employing a phase locked loop (PLL). Therefore, additional PLL-based embodiments are not discussed hereinbelow.

Figure 1:
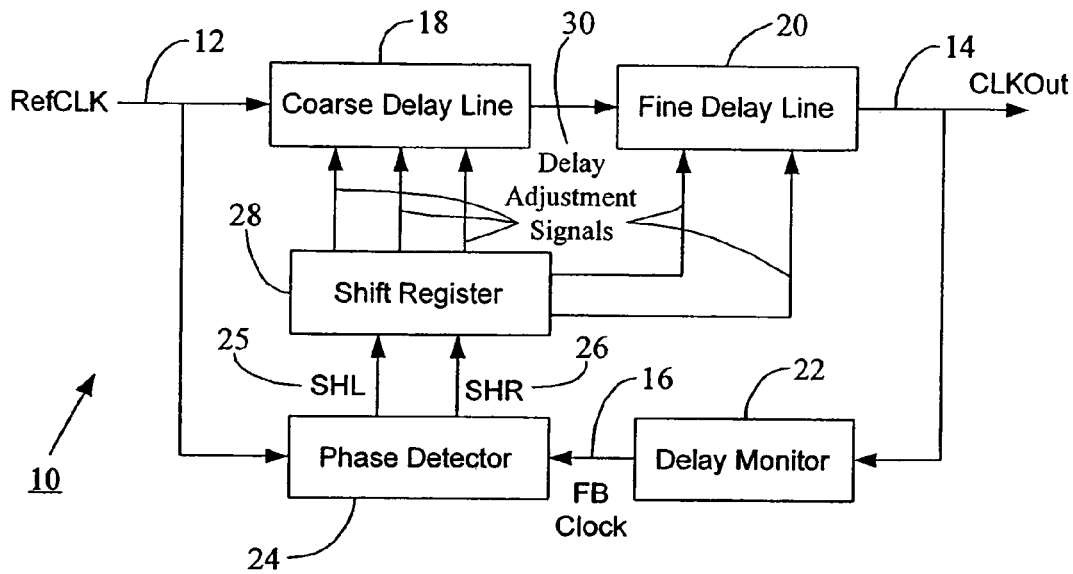
FIG. 1 depicts a simplified block diagram of a delay-locked loop.
Figure 2:
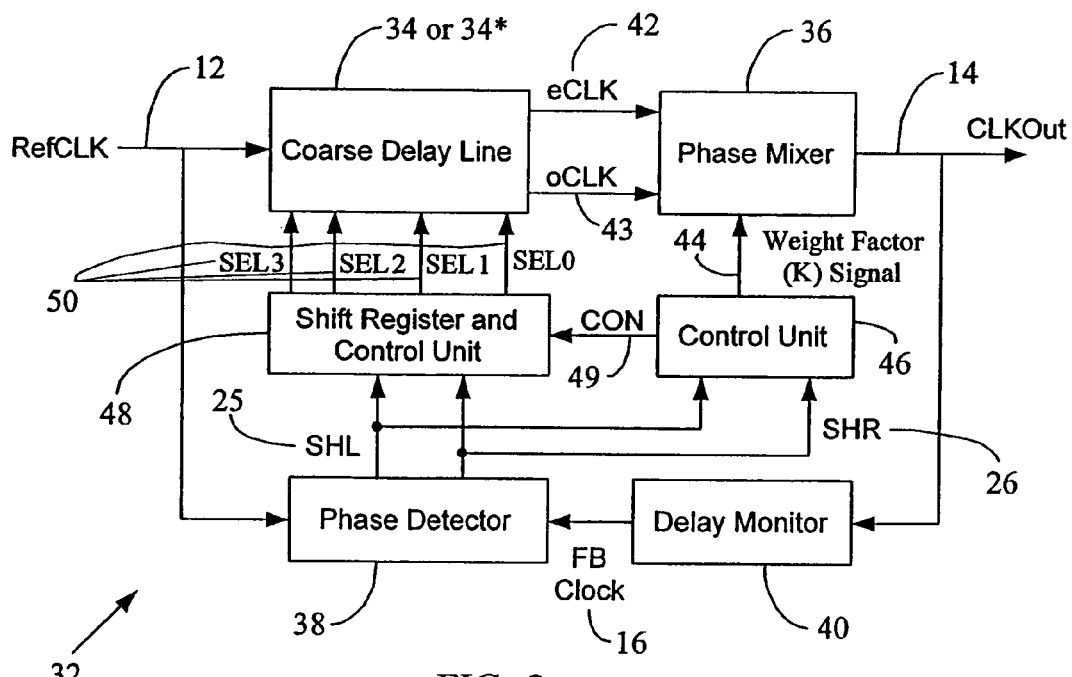
FIG. 2 illustrates an exemplary block diagram of a clock synchronization circuit according to one embodiment of the present disclosure.

FIG. 2 illustrates an exemplary block diagram of a clock synchronization circuit 32 according to one embodiment of the present disclosure. The synchronous circuit 32 in FIG. 2 is a delay locked loop (DLL) having a single delay line (as opposed to the dual delay line architectures including, for example, the architecture of FIG. 1) in the form of a coarse delay line 34 (discussed hereinbelow with reference to FIG. 3) or 34* (discussed hereinbelow with reference to FIG. 7). The fine delay adjustment may be accomplished using a digital phase mixer 36. The DLL 32 in FIG. 2 also includes a phase detector 38 and a delay monitor 40. The functionalities of the phase detector 38 and the delay monitor 40 may be similar those of the phase detector 24 and the delay monitor 22, respectively, in FIG. 1. Therefore, additional discussion for the phase detector 38 and the delay monitor 40 is not provided herein for the sake of brevity. It is also observed here that because of the similar clock synchronization purpose between the DLL 10 in FIG. 1 and the DLL 32 in FIG. 2, various clock and shift signals common between FIGS. 1 and 2 are referred to by the same reference numerals. Thus, for example, the reference numeral "12" is used to refer to the RefClk signal in FIGS. 1 and 2, the reference numeral "14" is used to identify the ClkOut signal in FIGS. 1 and 2, and so on. Additional discussion of these clock and shift signals is omitted for brevity.

In the embodiment of FIG. 2, the coarse delay line 34 is configured to generate two intermediate clock signals—the "even" clock or eCLK signal 42 and the "odd" clock or oCLK signal 43—from the input reference clock 12. It is noted here that the eCLK 42 and the oCLK 43 have a fixed (predetermined) phase difference therebetween. The constructional details and operation of the coarse delay line 34 according to one embodiment are discussed later hereinbelow with reference to the discussion of FIG. 3. The phase mixer 36 mixes the phases of the ECLK signal 42 and the oCLK signal 43 according to a weight factor (K), and outputs the ClkOut signal 14 having a phase that is between the phases of the eCLK 42 and the oCLK 43 as discussed later hereinbelow. The weight factor "K" may be supplied to the phase mixer 36 through a weight factor signal 44 generated by a control unit 46.

The control unit 46 controls the operation of the phase mixer 36 by outputting the weight factor signal 44 in response to the shift indication signal—i.e., the shift left (SHL) signal 25 or the shift right (SHR) signal 26—received from the phase detector 38. Thus, the weight factor signal 44 represents the phase shift necessary to achieve the "fine" tuning in the phase mixer 36. The weight factor signal 44 from the control unit 46 assures that the output clock 14 from the phase mixer 36 has a phase between the phases of the two delay clock signals—i.e., the eCLK signal 42 and the oCLK signal 43—input to the phase mixer 36 from the coarse delay line 34. In addition, the control unit 46 may also control the operation of a shift register and control unit 48 by outputting a control (CON) signal 49.

The shift register and control unit 48 (or, simply, "the shift register") may output shift "select" signals SEL0, SEL1, SEL2, etc., to select which units (discussed later hereinbelow) in the coarse delay line 34 be selected to accomplish the desired left shift or right shift operation as indicated by the SHL 25 and SHR 26 signals from the phase detector 38. The shift register 48 may perform the generation of these shift select signals (collectively referred to in FIG. 2 by the reference numeral "50") based on the status of the control (CON) signal 49 received from the control unit 46 and the SHL 25 and SHR 26 signals from the phase detector 38. For example, when the phase difference between the output clock 14 and the reference clock 12 is over the delay time of one delay unit (shown and discussed with reference to FIG. 3 later hereinbelow) in the coarse delay line 34, the control unit 46 and the phase detector 38 may instruct the shift register 48 via the CON signal 49 and the SHL 25 and SHR 26 signals, respectively, to perform the necessary shift operation by asserting appropriate shift select signals 50.

It is seen from the foregoing that the DLL 32 in FIG. 2 achieves synchronization between the reference clock 12 and the output clock 14 using just a single delay line 34 along with a phase mixer 36 and related phase detection, shifting and control circuitry. As discussed later hereinbelow, the generation of two intermediate clocks 42, 43 in the hierarchical delay line structure of FIG. 2—i.e., the coarse delay line 34 followed by the "fine" delay structure (as implemented using the phase mixer 36)—allows for coarse shifting at any time regardless of the reference clock's high/low value or frequency. Because the output clock 14 has a phase between the phases of the eCLK 42 and oCLK 43 signals, a seamless transition at the coarse-fine boundary may be accomplished without introducing jitter at high frequency clock operations.

Figure 3:
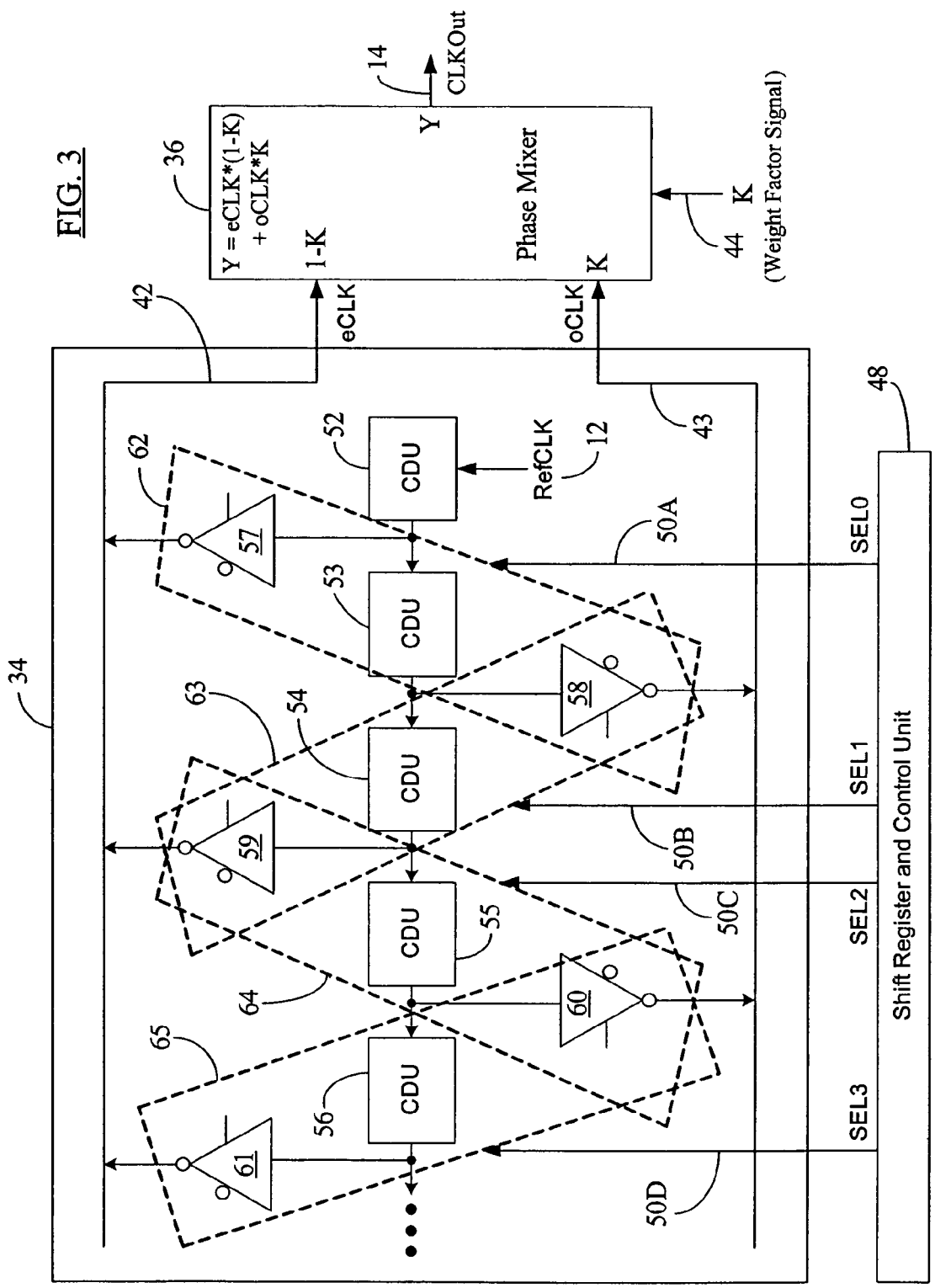
FIG. 3 shows in detail an exemplary architecture for the coarse and fine delay lines in the synchronization circuit of FIG. 2.

FIG. 3 shows in detail an exemplary architecture for the coarse delay line and fine delay structure 34 and 36, respectively, in the synchronization circuit 32 of FIG. 2. The coarse delay line 34 may include a plurality of coarse delay units (CDUs) 52, 53, 54, etc. The number of CDUs necessary to effect the desired coarse shifting may be determined, at the time of circuit design, based on the range of input reference clock frequencies to be handled by the DLL 32. For example, a high frequency operation may need significantly less coarse delay cells than an operation at a low reference clock frequency because of the clock period of a high frequency clock is less than that of a low frequency clock. Each CDU 52-56 may introduce a fixed, predetermined unit delay in the clock signal input thereto. Each CDU 52-56 may be designed to provide an effectively equal unit of delay. In one embodiment, each CDU 52-56 may provide a unit delay in the range of 300 ps-700 ps to accommodate for the PVT (process, voltage, and temperature) variations.

Figure 6A:
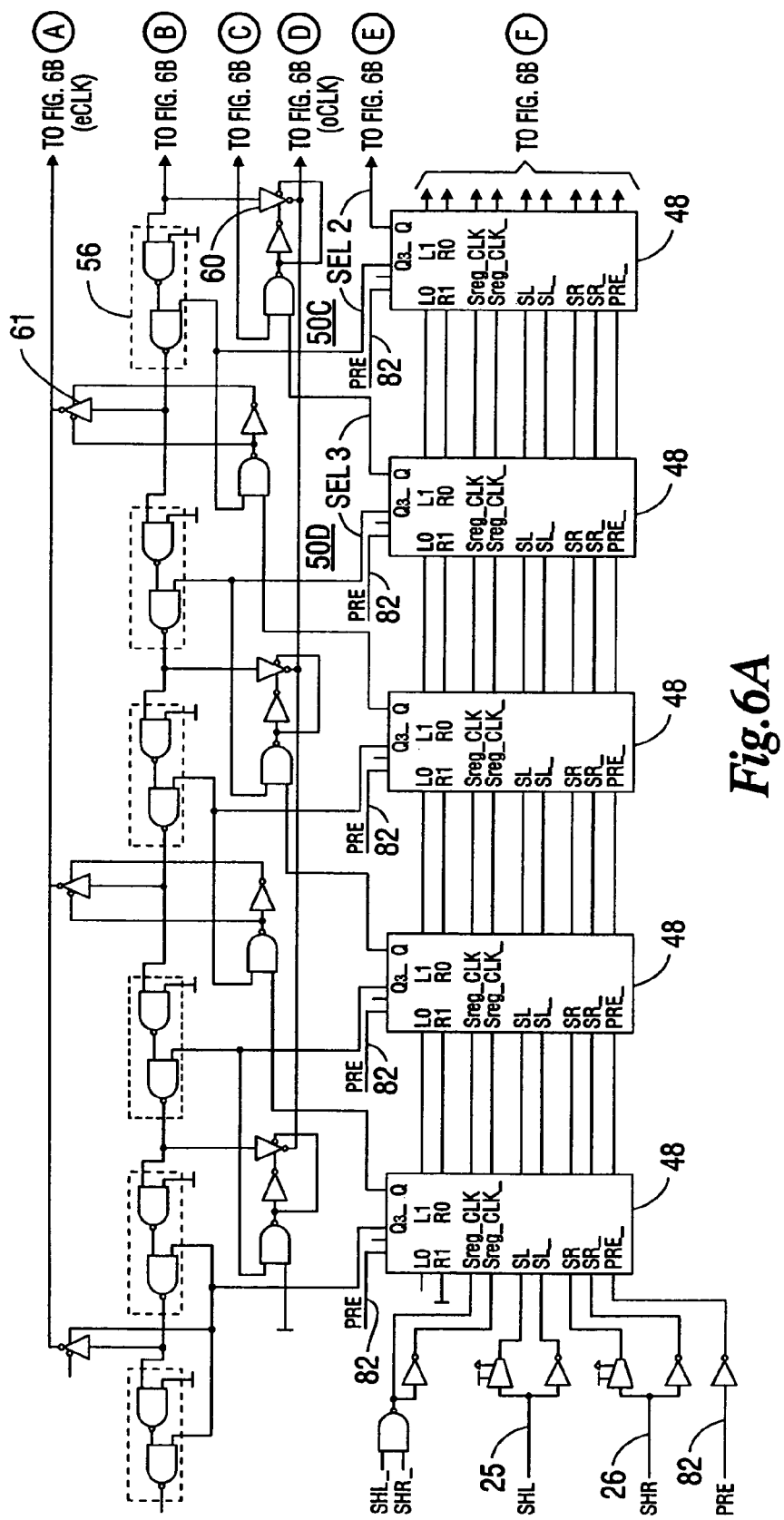
FIGS. 6A-6B depict a detailed circuit diagram according to one embodiment of the present disclosure for simulation of the clock synchronization circuit of FIG. 2.
Figure 6B:
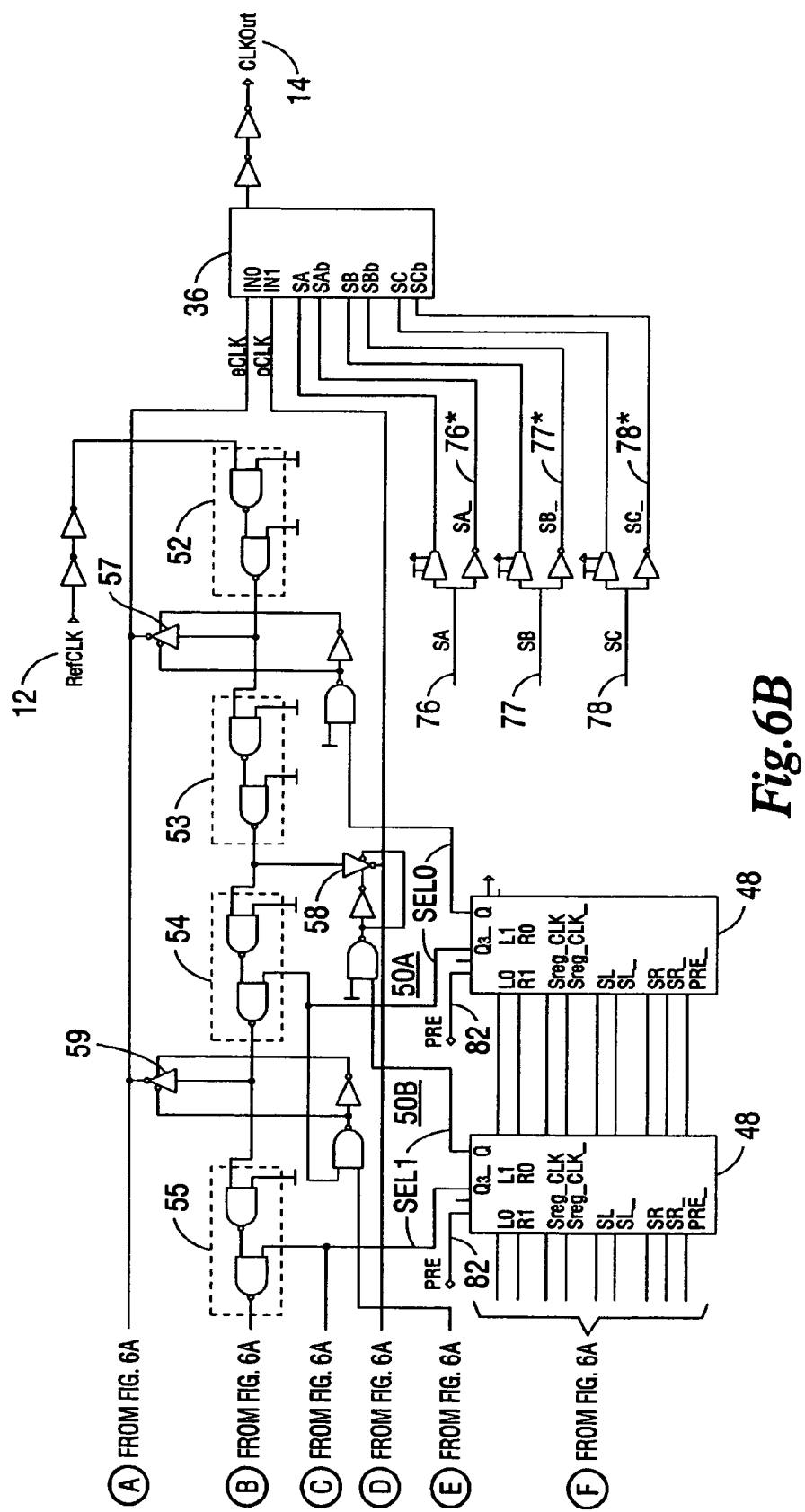

The coarse delay line 34 may also include a plurality of tri-state inverters (TSIs) 57, 58, 59, etc. As shown in FIG. 3, one tri-state inverter is connected between a pair of CDUs so that the output of each rightward preceding CDU is sent out of the delay line 34 via the TSI placed immediately leftward of that CDU. For example, the output of CDU 52 is sent as an input to the TSI 57, which, in turn, transfers it out of the delay line 34 via the eCLK signal 42. On the other hand, the output of CDU 53 is sent as an input to the TSI 58, which, in turn, transfers it out of the delay line 34 via the oCLK signal 43. For ease of discussion, each TSI in FIG. 3 may be numbered in an ascending order starting with number "0" for TSI 57, number "1" for TSI 58, number "2" for TSI 59, and so on. In the embodiment of FIG. 3, all even-numbered (0, 2, 4, etc.) TSIs 57, 59, 61, etc. are connected in such a manner as to share the same output line (i.e., the eCLK line 42); whereas, all odd-numbered (1, 3, 5, etc.) TSIs 58, 60, etc. share the other common output line (i.e., the oCLK line 43). In other words, the outputs of all even-numbered TSIs are combined to constitute the eCLK signal 42 and the outputs of all odd-numbered TSIs are combined to constitute the oCLK signal 43. The eCLK signal 42 and the oCLK signal 43 are inputs to the phase mixer 36 (which functions as a fine delay line) as shown in FIGS. 2 and 3. The CDUs are connected so as to form a chain of CDUs in the leftward direction. Thus, for example, the output of the first CDU 52 is connected to its immediately left CDU 53 whose output is in turn connected to the CDU 54, and so on. It is noted here that the terms "leftward" or "rightward" are used herein for ease of discussion only. In practice, the circuit configuration for the delay line 34 may not be identical to that shown in FIG. 3. For example, a real-life implementation of FIG. 3 may not have all CDUs organized in a straight line fashion on a semiconductor chip, as is known to one skilled in the art. It is also noted here that although the CDUs are organized in a series-connected chain, only the first CDU 52 is configured to directly receive the reference clock signal 12 that is input to the coarse delay line 34. All other CDUs in the chain may receive a delayed version of this clock signal as propagated to them through intervening CDUs under the control of the shift selection (SEL) signals 50 from the shift register and control unit 48 as discussed later hereinbelow. The circuit diagram in FIGS. 6A-6B illustrate exemplary constructional details of unit delay cells or CDUs that may be used in the coarse delay line 34.

As mentioned hereinbefore, in the embodiment of FIG. 3, the phase difference between the eCLK 42 and the oCLK 43 signals is fixed. In one embodiment, a time value of the fixed phase difference is equal to the time delay provided by one delay unit (CDU) in the coarse delay line 34. This $t_{CDU}$ (the unit delay provided by a single CDU in the delay line 34) of time delay between the phases of eCLK 42 and oCLK 43 signals may be achieved by the TSI-based "even" and "odd" output connections as illustrated in FIG. 3. The control unit 46, on the other hand, outputs the weight factor signal 44 to control the phase mixing in the phase mixer 36 so as to obtain the phase of the output clock 14 between the phases of the two delay clock signals eCLK 42 and oCLK 43, thereby generating the output clock 14 having a phase that is approximate to the phase of eCLK 42 or oCLK 43 depending on the left or right shifts recommended by the phase detector 38. That is, the phase mixer 36 generates the mid-phase clock (i.e., the ClkOut signal 14) by interpolating between the phases of its two input clocks—eCLK 42 and oCLK 43—according to the weight factor "K" supplied to it by the control unit 46 via the weight factor signal 44.

In the embodiment of FIG. 3, the operation of the phase mixer 36 may be defined by the following equation:

$$\text{ClkOut} = \text{eCLK}*(1-K) + \text{oCLK}*K \quad (1)$$

As noted before, the value of the weight factor "K" ($0 \leq K \leq 1$) may be defined by the weight factor or control signal 44 from the control unit 46. When "K" is increased, the output clock 14 has a phase approximately equal to the phase of the delay clock signal oCLK 43. When "K" is decreased, however, the output clock 14 has a phase approximately equal to the phase of the delay clock signal eCLK 42. For example, as seen from equation (1), if "K" is set to "0", the ClkOut signal 14 will have the same clock as the eCLK signal 42 (ignoring, for ease of discussion, the delay of the phase mixer 36 itself), but if "K" is set to "1", the ClkOut signal 14 will have the same clock as the oCLK signal 43 (again ignoring the phase mixer's 36 internal delay). However, if "K" is "0.5", then the output clock 14 will have a center-phase between ECLK 42 and oCLK 43 signals.

It is observed that during initialization of DLL 32, the SR (shift right) mode may not be allowed, even though the DLL 32 could be in the SR region (i.e., the timing relationship between RefCLK 12 and ClkOut 14 may indicate a need to perform a shift right operation) because there is no delay unit (CDU) on the right side of CDU 52 (i.e., the reference clock entry point in the coarse delay line 34) in FIG. 3. Furthermore, in one embodiment, at the time of initialization of DLL 32 (e.g., at system start-up or system reset), the control unit 46 is configured to set the value of weight factor "K" equal to "0". In this situation, the CON signal 49 will instruct the shift register 48 to assert only the SEL0 shift selection signal 50A. The coarse delay line 34 is configured in such a manner that a "high" value on the SEL0 signal 50A will enable (or activate) only the first two CDUs 52-53 and their corresponding TSIs 57-58. The other CDUs and TSIs in the coarse delay line 34 remain turned off or inactive at this time. With the SEL0 signal 50A asserted, the eCLK signal 42 is generated through one CDU (i.e., the CDU 52), whereas the oCLK signal 43 is generated through two CDUs (i.e., the CDU 52 and 53) from the input reference clock 12 as can be seen from the circuit configuration of FIG. 3. But, when K=0, the ClkOut signal 14 at the output of the phase mixer 36 will have the same phase as the eCLK input 42 to the phase mixer 36 (ignoring, for the sake of simplicity, the delays in the TSI 57 and the phase mixer 36). The phase detector 38 will then compare the phase of this ClkOut signal 14 (as represented by the phase of the FB clock 16) and the input reference clock 12, and if the phase detector 38 finds that more delay is needed in the ClkOut signal 14, the phase detector 38 may indicate the need for more delay through its shift indication signal SHL 25. Upon receiving the new SHL signal 25, the control unit 46 "interprets" this shift indication signal from the phase detector 38 and, in response, may further increase the value of the weight factor "K" and supply the new value to the phase mixer 36 via the weight factor signal 44. The larger the value of "K," the more delay is added to the ClkOut signal 14, and when K=1, the phase of ClkOut signal 14 will be the same as that of the oCLK signal 43 input to the phase mixer 36 (as can be seen from the equation (1) given hereinbefore, and, ignoring, for the sake of simplicity, the delays in the TSI 58 and the phase mixer 36).

If phase detector 38 determines that there is still more delay needed in the output clock 14, even with K=1, it may again assert the SHL signal 25. In that event, the control unit 46 may instruct the shift register 48 (via the CON signal 49) to perform another shift left operation and enable the SEL1 shift selection signal 50B instead of the SEL0 signal 50A. Thus, the SEL0 signal 50A will be disabled, but, now, the SEL1 signal 50B will be active. When the SEL1 signal 50B is asserted, the delay line 34 will activate one more leftward CDU (i.e., the CDU 54) in addition to the two previous CDUs 52-53 already activated by the SEL0 signal. Upon assertion of the SEL1 signal SOB, the delay line 34 will also activate the TSI (i.e., the TSI 59) associated with the newly-activated CDU 54. In other words, when the SEL1 signal 50B is active, there will be three CDUs 52-54 and two TSIs 58-59 active in the delay line 34. The assertion of SEL1 signal will turn off the previously activated TSI 57, but maintain CDUs in prior stages active. All other CDUs and TSIs will also remain deactivated or turned off. The activation of the SEL1 signal 50B will not reset the most recent value of K (here, K=1). However, the assertion of the SEL1 signal 50B will change only the eCLK's 42 phase from one CDU delay (i.e., delay by CDU 52) to three CDUs delay (i.e., delays by CDUs 52-54) because the eCLK 42 now includes output from the TSI 59, which is generated after the reference clock 12 is delayed by three intervening CDUs 52-54. The SEL1 signal SOB, however, will not change the phase of oCLK 43 because, except for the originally-activated (by the SEL0 signal 50A) first odd-numbered TSI 58, no additional odd-numbered TSI is activated by the activation of the SEL1 signal 50B. With the value of K still equal to "1", the output of the phase mixer 36 (i.e., the ClkOut signal 14) is not changed because the phase mixer 36 is still bypassing the oCLK signal 43 to its output (as seen from inserting the value of K=1 in equation (1)). Thus, even though additional coarse delays have been activated in the delay line 34 by the SEL1 signal 50B, there is no change in the output clock 14. Thus, this new coarse shifting with SEL1 does not introduce any jitter or noise in the output clock 14.

However, after the SEL1 signal 50B is asserted and "K" has a value of "1", it is determined by the control unit 46 (based on the shift indication received from the phase detector 38) to decrease the value of "K" to achieve proper "fine" tuning between the RefClk 12 and the output clock 14, the phase of the output clock 14 can be delayed more and more. Because, from this time (i.e., from the time the value of "K" starts to decrease), the eCLK signal 42 will start playing a role (because, now K<1) in the generation of the output from the phase mixer 36, and, as seen from the architecture in FIG. 3, the eCLK signal 42 has more delayed phase than the oCLK signal 43 when SEL1 is asserted because of eCLK's generation after three CDU (CDUs 52-54) delay versus oCLK's generation after two CDU (CDUs 52-53) delay. On the other hand, even when K=0 while SEL1 is activated, if it is determined by the phase detector 38 to further left shift the ClkOut signal 14, then, with K=0, the control unit 46 may again instruct the shift register 48 (via the CON signal 49) to deactivate the SELL input 50B to the delay line 34 and, instead, activate the SEL2 input 50C. The activation of the SEL2 signal 50C will activate the CDUs 52-55 and TSIs 59-60, thereby introducing an additional delay in generation of the oCLK signal 43, but the phase of the eCLK 42 will not change because of no additional CDU is activated in the generation path of the eCLK signal 42. The value of "K" may now be increased from this point (i.e., from the K=0 situation) to obtain the desired "fine" tuning in the phase mixer 36. Thus, the value of "K" may swing between "0" and "1" while an SEL signal is activated. As discussed hereinbefore, the phase change in the oCLK 43 may occur when K=0, but the phase change in the eCLK 42 may occur when K=1.

It is noted here that the above description of operation of the circuit in FIG. 3 is overly simplistic. At high frequency operations in practice, the determination of optimum value of "K" for a given SEL signal may be done in not more than a few clock cycles of time to establish a quick "lock" condition. Further, the above described mechanism of selective activation/deactivation of CDUs and their corresponding TSIs (using the SEL# shift selection inputs) may remain the same even with a shift-right operation (instead of the shift-left operation described hereinabove) in the shift register 48 for decreasing the delay at the coarse/fine boundary. This selective activation or deactivation of two or more CDUs and their corresponding TSIs by activation of appropriate SEL signals is illustrated in FIG. 3 by the dotted groups 62-65 of CDUs and TSIs and by showing each SEL signal associated with its corresponding group. It is understood that the illustration of dotted groups 62-65 is for ease of discussion only. The actual circuit implementation may be different from the layout indicated in FIG. 3 as can be seen from the exemplary circuit diagram in FIGS. 6A-6B.

It is observed here that each activation of leftward SEL signal activates an additional leftward CDU, but deactivates one prior activated (rightward) TSI. Thus, TSIs in FIG. 3 are turned on and off depending on the status of the SEL signal of its corresponding section, but CDUs are turned on in an additive manner. If the SEL input to a TSI's section is deactivated, that TSI will also be turned off unless the TSI belongs to the newly-activated section. For example, when the SEL1 signal 50B is applied to group 63, it will activate the additional CDU 54 and its corresponding TSI 59, but the earlier activated TSI 57 will now be deactivated because of deactivation of the SEL0 input 50A. The earlier activated TSI 58 will, however, not be turned off because it also belongs to the group 63 (in addition to group 62) which is currently receiving the SEL1 input 50B. Similarly, when the SEL2 input 50C is asserted to group 64 and the SEL1 input 50B to group 63 is deasserted, the additional leftward CDU 55 and its corresponding TSIs 59-60 belonging to group 64 are activated, but the earlier activated TSI 58 in group 63 is now deactivated because of the deassertion of the SEL1 input 50B. Similar activation/deactivation process occurs for other SEL inputs.

Figure 4:
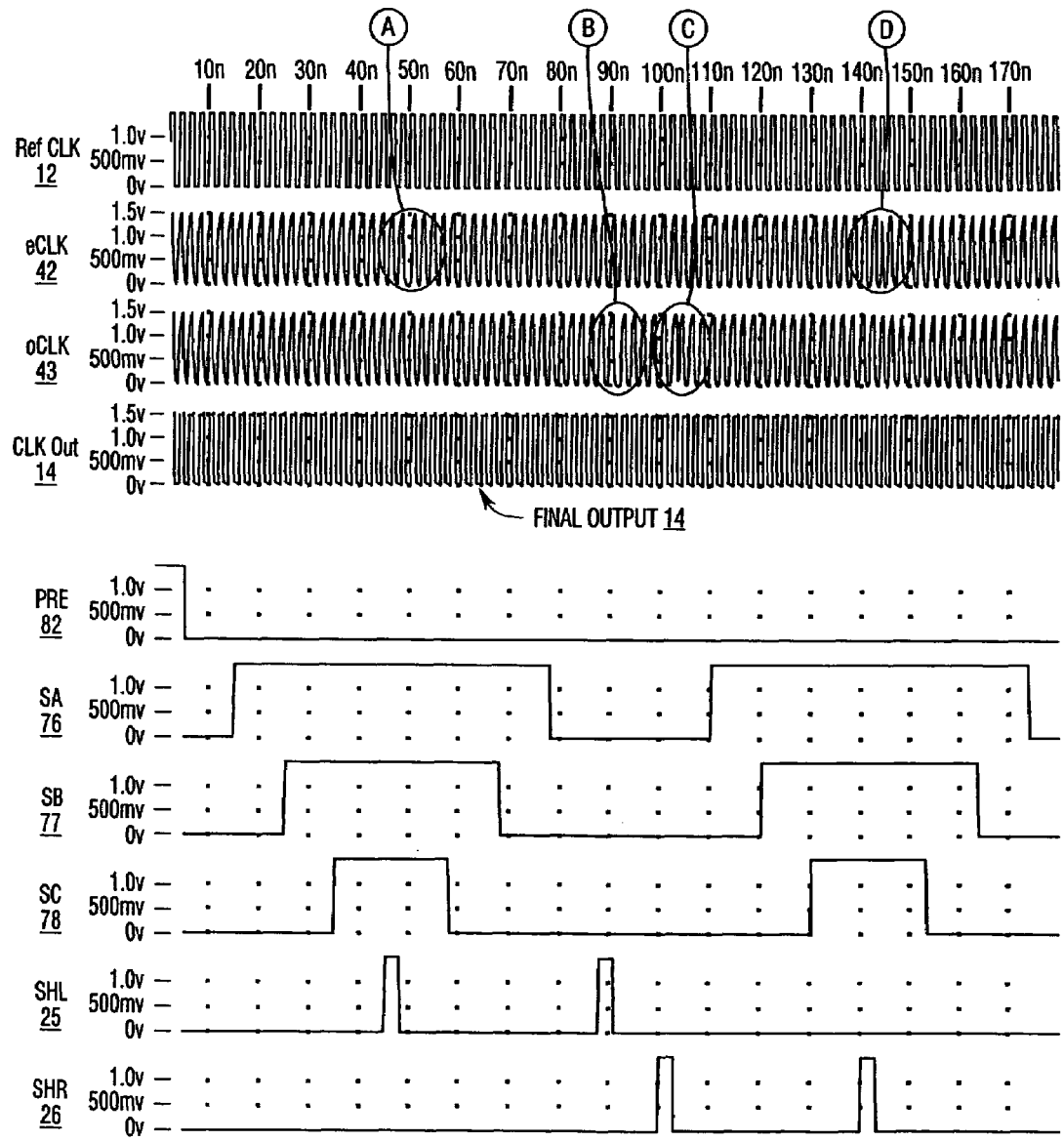
FIG. 4 illustrates an exemplary simulation of various clock and other signals in the synchronization circuit of FIG. 2 and also illustrates the seamless switching (as reflected in the "clean", final output clock) at the coarse-fine boundary using the coarse and fine delay line architecture of FIG. 3.

FIG. 4 illustrates an exemplary simulation of various clock and other signals in the synchronization circuit of FIG. 2 and also illustrates the seamless switching (as reflected in the "clean", final output clock) at the coarse-fine boundary using the coarse and fine delay line architecture of FIG. 3. The SA, SB, and SC signals 76-78, respectively, shown in FIG. 4 (and also shown in more detail in FIGS. 5 and 6) constitute the weight factor signal 44 (from the control unit 46) carrying the value of weight factor "K" The combination of various states of SA, SB, and SC signals 76-78 (and their complements SAb, SBb, and SCb signals 76*-78* in FIG. 5) at a given instant in time may be used to indicate a specific value for "K" at that instance in time. The shift left (SHL) and shift right (SHR) signals 25-26 from the phase detector 38 are also shown as a way of an example in FIG. 4. A system reset signal (PRE) 82 is also shown in FIG. 4 (and in more detail in FIG. 6A) to indicate an exemplary voltage level at the time of initialization of the DLL 32. It is seen from the simulation waveforms of RefClk 12, eCLK 42, oCLK 43, and ClkOut 14 that although there are occurrences of phase changes in the ECLK 42 and oCLK 43 waveforms (as pointed out by the circled letters A, B, C, and D in FIG. 4) because of the assertion of SHL 25 and SHR 26 signals (and, hence, assertion of appropriate SEL signals from the shift register 48), the final output clock (i.e., the ClkOut signal 14) is absent of any jitter or noise caused by such coarse shifting in the delay line 34. Thus, the output clock 14 is "clean" (i.e., substantially similar to the input reference clock 12) despite the coarse phase shiftings (at instances A, B, C, and D) occurring at significantly high clock frequency.

It is noted here that because of the generation of the eCLK 42 and oCLK 43 using the architecture of FIG. 3, there is always a fixed, one CDU delay ($t_{CDU}$) between the phases of eCLK 42 and oCLK 43 input to the phase mixer 36, regardless of which SEL signal is activated at a given instance. In other words, the left or right shifting mandated by the phase detector 38 and, hence, by the shift register 48, does not affect the fixed, phase delay between the two intermediate clocks 4243 that are input to the phase mixer 36. Thus, the phase mixer 36 receives the eCLK 42 and oCLK 43 signals with this fixed $t_{CDU}$ of delay therebetween, despite the changes in the amount of coarse delay (i.e., activation or deactivation of one or more CDUs in the delay line 34) being effected inside the coarse delay line 34 by the SEL signals from the shift register 48. Because of this fixed delay between eCLK 42 and oCLK 43, the generation of the output clock 14 through the phase mixer 36 becomes independent of the high frequency jitter or phase changes that may be present in the intermediate clocks 42-43. The final "fine" tuning may be achieved in the phase mixer 36 by supplying varying values of "K" ($0 \leq K \leq 1$) until the desired output clock signal 14 is obtained. Therefore, as seen from the simulation waveforms in FIG. 4, the effect of changes in coarse delays (in the delay line 34) is not manifested in the output (i.e., the ClkOut signal 14) of the fine delay unit (here, the phase mixer 36). The generation of intermediate clocks 4243 with a fixed phase delay therebetween thus results in a seamless transition from coarse delay to fine delay as reflected in the final output clock 14 in FIG. 4.

Figure 5:
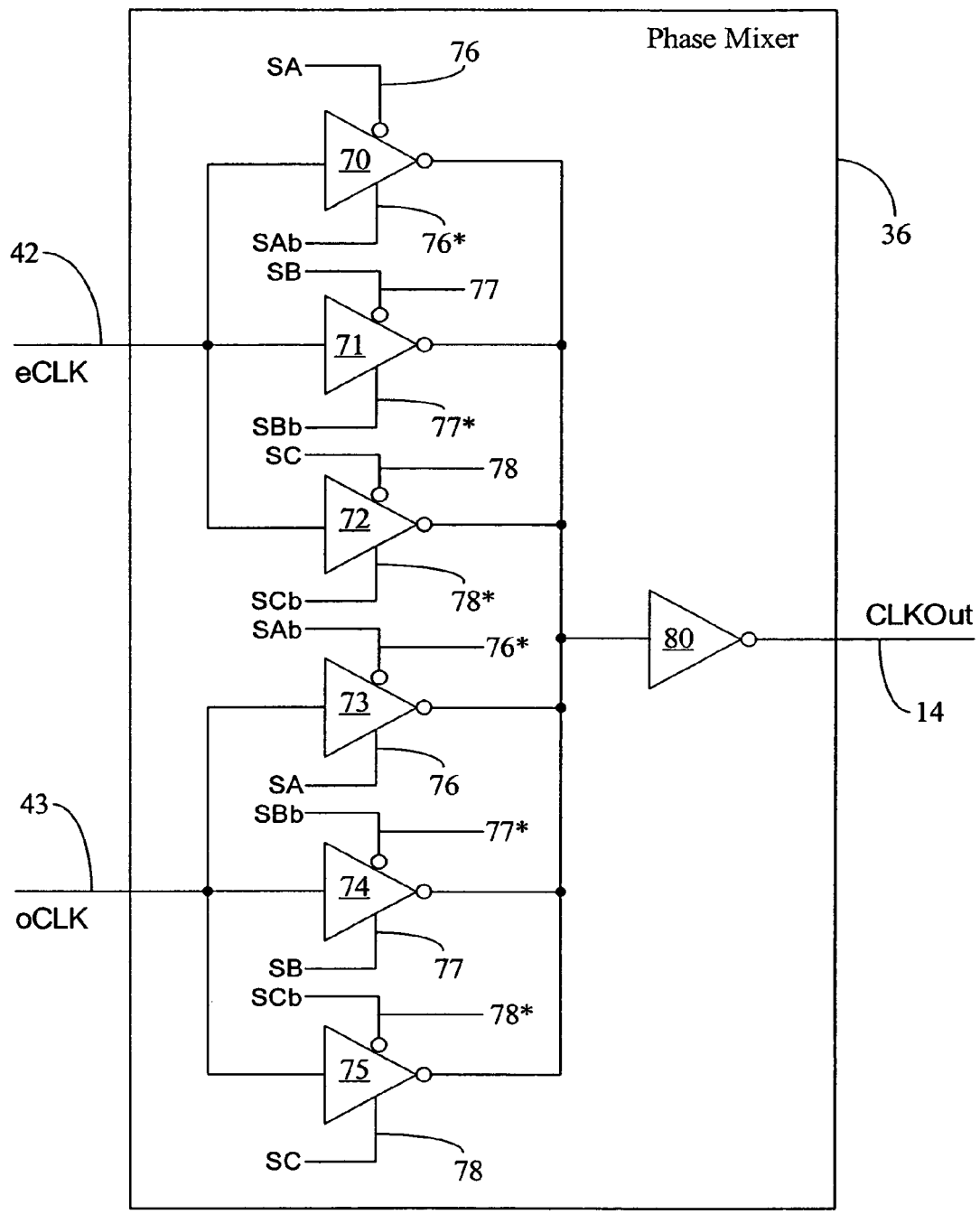
FIG. 5 shows an exemplary circuit constituting the phase mixer depicted in FIG. 2.

FIG. 5 shows an exemplary circuit constituting the phase mixer 36 depicted in FIG. 2. As shown in FIG. 5, the eCLK input 42 to the phase mixer 36 may be fed to a first set of tri-state inverters (TSIs) 70-72 and the oCLK input 43 may be fed to a second set of TSIs 73-75. The outputs of all these TSIs 70-75 are combined and applied to an inverter 80 to generate the final output clock 14. The weight factor "K" may be received through the control unit 46 in the form of a group of digital signals SA-SC 76-78, respectively. The phase mixer 36 may also receive a complement of each of these signals, i.e., signals SAb-SCb 76*-78*, respectively, as shown in the exemplary circuit diagram of FIGS. 6A-6B. The signals (i.e., signals SA-SC 76-78) constituting the weight factor "K" may be applied in a complementary manner to various TSIs as illustrated in FIG. 5. For example, the enable inputs of TSI 70 for the eCLK signal 42 are SA 76 and SAb 76*, whereas a similarly-situated TSI 73 for the oCLK signal 43 receives this same set of enable inputs, but connected to TSI 73 in a complementary manner as can be seen from the schematic in FIG. 5. Other enable inputs SB-SC and their complements SBb-SCb are also connected to their respective tri-state inverters in such a complementary manner as can be seen from FIG. 5. Using such complementary connections, it is possible to implement the phase mixing functionality given by equation (1) hereinbefore.

FIGS. 6A-6B depict a detailed circuit diagram according to one embodiment of the present disclosure for simulation of the clock synchronization circuit of FIG. 2. The circuit schematic in FIGS. 6A-6B illustrates the shift register 48, the coarse delay line 34, and the phase mixer 36 blocks in FIG. 2 in more detail. A few of the signal lines in FIGS. 6A-6B are labeled with reference numerals to provide context with reference to FIGS. 2-3. Although neither a discussion of FIGS. 6A-6B nor an exhaustive component labeling is provided herein for various circuit elements in FIGS. 6A-6B, it is noted that the operation of the circuit in FIGS. 6A-6B may be easily understood by one skilled in the art upon comparison with the block diagrams in FIGS. 2-3 and based on the earlier discussion of the operation of the DLL 32 in FIG. 2 and the operation of the coarse delay line 34 in FIG. 3. It is observed here that the circuit schematic in FIGS. 6A-6B is for illustrative purpose only. A circuit designer may implement the DLL 32 in FIG. 2 and the coarse delay line 34 in FIG. 3 in many other different ways using the teachings of the present disclosure.

It is noted here that the DLL 32 according to one embodiment of the present disclosure may receive reference clock frequencies in the range of 800 MHz-1 GHz. In that case, a small clock jitter may distort the duty cycle. Therefore, it may be preferable to utilize a reference clock frequency with a 50% duty cycle. Furthermore, as discussed hereinbefore, the utilization of the intermediate clock generating architecture for the coarse delay line 34 (FIG. 3) along with a digital phase mixer 36 for fine delay tuning may result in a jitter-free generation of the output clock 14 even when the DLL 32 is operated at such high reference clock frequencies. Using the coarse and fine delay structures of FIGS. 3 and 5, it may be possible to perform clock shift operations at any time regardless of the input (reference) clock's high or low values or frequency. The fixed, one unit of phase delay between the intermediate clocks eCLK 42 and oCLK 43 allows the phase mixer 36 to perform the "fine" tuning and generate the ClkOut signal 14 without transmitting any clock jitters or phase changes that may arise during coarse shifting (in the coarse delay line 34) to the ClkOut signal 14. The output clock's 14 jitter performance can thus be increased even at a very high frequency operation while using only a small silicon area because a high frequency operation may not need many coarse delay cells or CDUs (FIG. 3). Further, with the use of the hierarchical delay line structure of FIGS. 2-3 wherein only one coarse delay line and one phase mixer are used for obtaining coarse and fine delays, respectively, the size of the final DLL unit 32 and power consumption in the DLL 32 may be significantly optimized.

It is observed here that, in the coarse delay line structure of FIG. 3, because one input (e.g., the eCLK signal 42) of the phase mixer 36 can get coarse shift (in the delay line 34) only when the phase mixer 36 bypasses the other input (e.g., the oCLK signal 43) to its output line as the ClkOut signal 14, there is no limitation in controlling the coarse shifting within the delay line 34 and the phase change at the coarse-fine boundary is seamless (as reflected in the simulation of the output clock 14 illustrated and discussed hereinbefore with reference to FIG. 4). However, because all even-numbered TSIs 57, 59, 61, etc. in FIG. 3 share the same output line to generate the eCLK signal 42 and because all odd-numbered TSIs 58, 60, etc. in FIG. 3 share the same output line to generate the oCLK signal 43, there may be a large junction load at the eCLK 42 and oCLK 43 inputs to the phase mixer 36, especially when a long coarse delay line 34 (i.e., a delay line 34 with a large number of CDUs and TSIs) is used. However, as noted before, in case of a high frequency operation, there may not be a need to use many coarse delay cells (CDUs), and, hence, such loading may be avoided.

FIG. 7 illustrates another exemplary architecture according to one embodiment of the present disclosure for the coarse and fine delay lines in the synchronization circuit 32 of FIG. 2. It is seen from a comparison of FIGS. 3 and 7 that the coarse delay line 34* in FIG. 7 is substantially similar to the coarse delay line 34 in FIG. 3, except for its hierarchical exit point structure to further reduce junction parasitic load at the eCLK 42 and oCLK 43 inputs to the phase mixer 36 as discussed later hereinbelow. In other words, the delay line 34* in FIG. 7 may be considered as another embodiment of the delay line 34 of FIG. 3 and, hence, the delay line 34* may be used instead of the delay line 34 in the synchronization circuit 32 of FIG. 2. Therefore, identical circuit elements or signal lines having similar functionality in FIGS. 3 and 7 are denoted by the same reference numerals for ease of discussion. In FIG. 7, the structural elements in addition to those shown in FIG. 3 include the CDUs 83-88 and their corresponding TSIs 89-95 in the first level of TSIs, the groups of CDUs and TSIs designated by reference numerals 96-102, the TSIs 103-106 in the second level, the logical OR gates 107-110, the even- and odd-grouped-cell lines 42A-42B and 43A-43B, respectively, and the additional SEL inputs SEL4 (50E) through SEL10 (50K) from the shift register and control unit 48. The overall function of the delay line 34* and phase mixer 36 combination in FIG. 7 is the same as that for the delay line 34 and phase mixer 36 combination in FIG. 3. Therefore, operational details common between the circuit configurations in FIGS. 3 and 7 are not repeated hereinbelow for the sake of brevity.

It was observed with reference to FIG. 3 that because all even-numbered TSIs 57, 59, 61, etc. in FIG. 3 share the same output line to generate the eCLK signal 42 and because all odd-numbered TSIs 58, 60, etc. in FIG. 3 share the same output line to generate the oCLK signal 43, there may be a large junction parasitic load at the eCLK 42 and oCLK 43 inputs to the phase mixer 36, especially when a long coarse delay line 34 is used. However, to achieve low junction parasitic load even with a long coarse delay line, the hierarchical exit point delay line structure of the coarse delay line 34* in FIG. 7 may be used instead. In the delay line 34*, the outputs of even and odd delay stages are grouped in two hierarchical levels—the first level of grouping achieves low junction parasitic load, and the second or "higher" level of grouping accomplishes better higher frequency operation. In FIG. 7, the first level of grouping obtains the even- and odd-grouped-cell lines 42A-42B and 43A-43, respectively, whereas the second level of grouping obtains the eCLK 42 and oCLK 43 signals. For example, in the first level of grouping, the outputs of the first set of four even-numbered TSIs 57, 59, 61, and 90 are grouped to constitute the grouped-cell line 42A; the outputs of the second set of four even-numbered TSIs 92, 94, and other two TSIs (not shown) are grouped to constitute the grouped-cell line 42B; the outputs of the first set of four odd-numbered TSIs 58, 60, 89, and 91 are grouped to constitute the grouped-cell line 43A; and the outputs of the second set of four odd-numbered TSIs 93, 95, and other two TSIs (not shown) are grouped to constitute the grouped-cell line 43B. Additional groupings in the similar manner may be performed depending on the size of the delay line 34*. The grouped-cell lines 42A-42B and 43A-43B in the first level are connected to respective intermediate clock lines eCLK 42 and oCLK 43 via another (second) level of TSIs 103-106 as shown in FIG. 7.

Although the number of cells (TSIs) per group is "4" (four) in each first level of grouping, and the number of hierarchical levels is "2" (two) in the embodiment of FIG. 7, these numbers may be changed depending on the size of the coarse delay line 34* (e.g., more delay units and TSIs may require an increase in the number of hierarchical levels) or on other design considerations (e.g., desired level of junction parasitic load, the expected range of input clock frequencies, etc.). Furthermore, although the discussion herein with reference to FIG. 7 refers to these hierarchical "levels," these "levels" are more conceptual in nature (for ease of discussion) than physically well-defined boundaries or rigid segments within a real life circuit implementation of the delay line strcutrue 34* in FIG. 7 as can be seen from the detailed circuit layouts in FIGS. 9A-9C.

In operation, the SEL# inputs 50A-50K (SEL0 through SEL10) in FIG. 7 perform selective activation/deactivation of CDU-TSI groups 62-65 and 96-102 in the same manner as that described with reference to FIG. 3. However, instead of supplying the outputs of even- and odd-numbered TSIs directly to the eCLK 42 and oCLK 43 signals, respectively, as was the case in the embodiment of FIG. 3, the outputs of each set of four TSIs (even- or odd-numbered) are grouped together in the embodiment of FIG. 7 to form the grouped-cell lines 42A-42B and 43A 43B as shown. Each of these grouped-cell lines is, in turn, connected as an input to a respective TSI 103-106 in the second hierarchical level. The TSIs 103-106 in the second level may also be given odd and even numbers similar to the TSIs in the first level. Thus, for example, TSIs 103-106 may be referred to by odd or even numbers starting with number "0" for TSI 103, number "1" for TSI 104, number "2" for TSI 105, number "3" for TSI 106, and so on. The output of each even-numbered TSI 103, 105, etc. in the second hierarchical level is combined to generate the eCLK signal 42, and the output of each odd-numbered TSI 104, 106, etc. in the second hierarchical level is combined to generate the oCLK signal 43 as shown in FIG. 7.

Figure 9A:
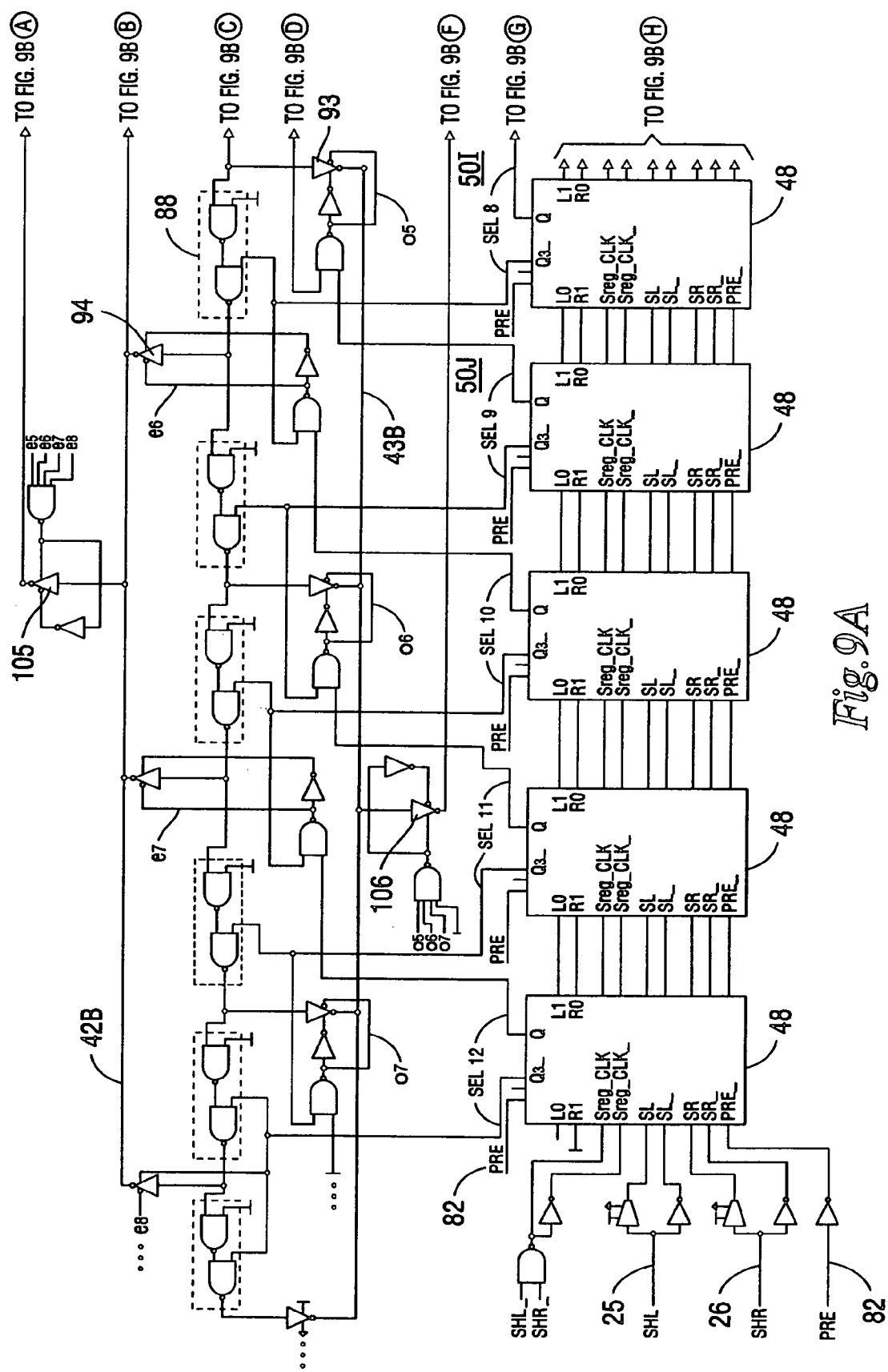
FIGS. 9A-9C depict a detailed circuit diagram according to one embodiment of the present disclosure for simulation of the clock synchronization circuit of FIG. 2.
Figure 9B:
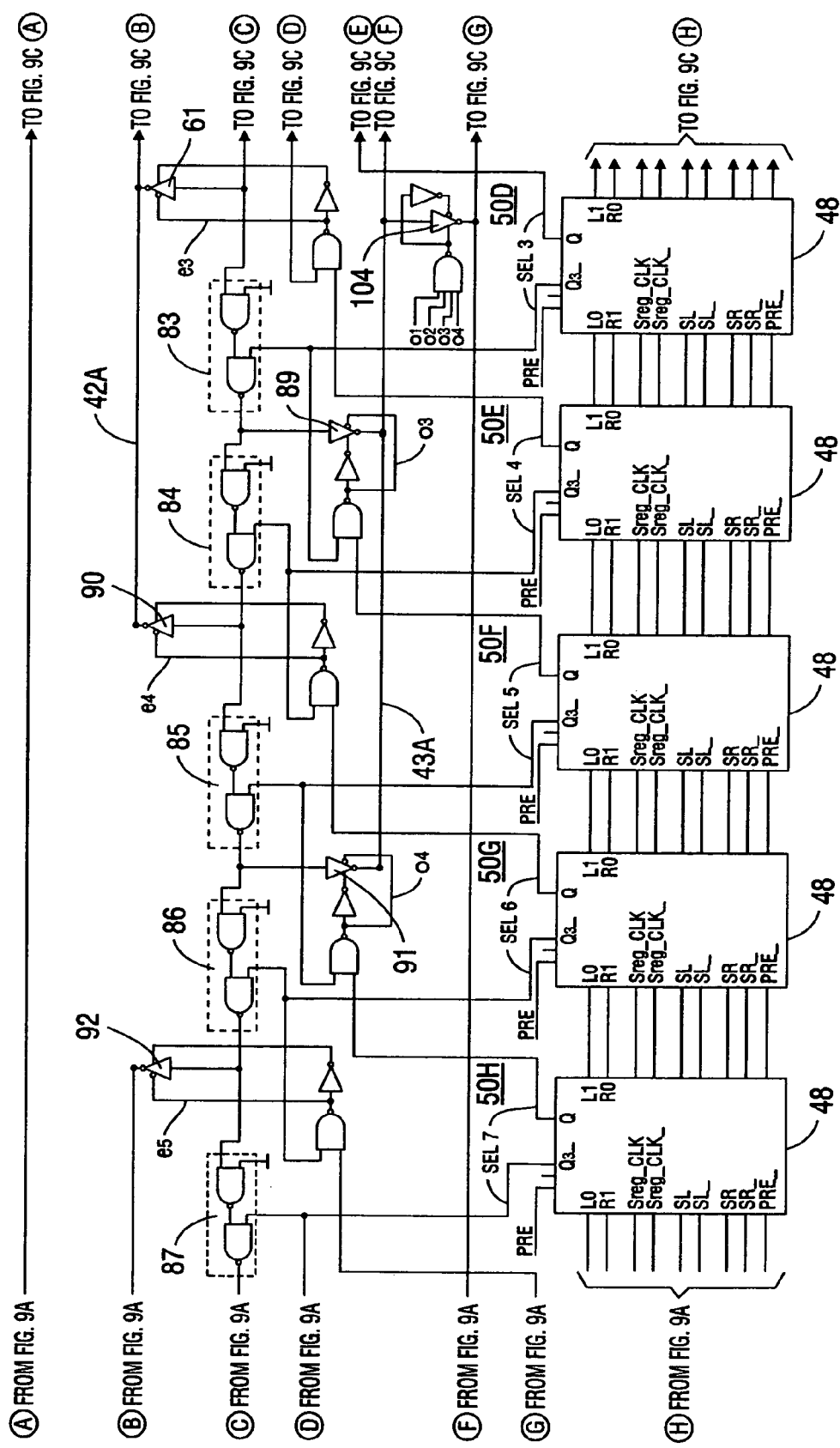
Figure 9C:
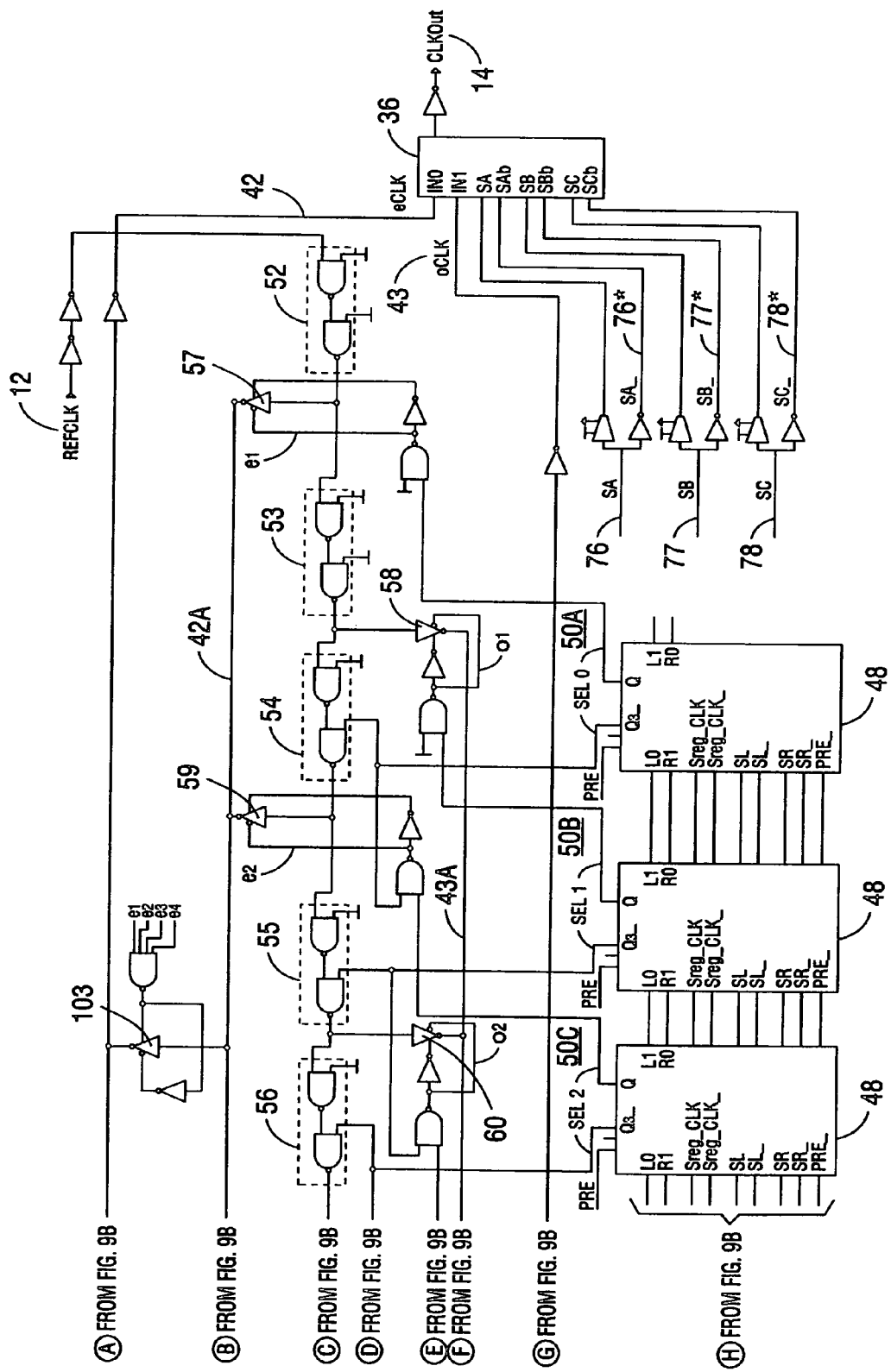

In the embodiment of FIG. 7, each "outputting" TSI 103-106 is selectively activated by one of the SEL inputs associated with and operating on the first (or "lower") level of groups whose outputs constitute the corresponding grouped-cell line that is input to the respective TSI 103-106. Thus, for example, the even-numbered TSI 103 in the second level is activated by SEL inputs SEL0 (50A) through SEL6 (50G) signals because each of the SEL0-SEL6 signals plays a role in generating an output on the even-grouped-cell line 42A, which is supplied as an input to the even-numbered "outputting" TSI 103. Thus, any of the seven select inputs SEL0 through SEL6 can turn on or enable the TSI 103 to supply an output on the eCLK line 42. Similarly, the odd-numbered TSI 104 is activated by each of the SEL0 through SEL7 signals because output of each one of the odd-numbered TSIs 58, 60, 89, and 91 in the first level is affected by at least one of these eight select inputs SEL0 through SEL7. And, the outputs of the first level of odd-numbered TSIs 58, 60, 89, and 91 are combined in the grouped-cell line 43A to constitute the input to the odd-numbered "outputting" TSI 104 in the second level. In the embodiment of FIG. 7, each second level of TSI is activated or enabled by an output from a multi-input OR gate 107-110 whose inputs are the appropriate SEL signals as shown. It is noted that other logic gates or inputting circuits may be used instead of the OR gates 107-110 to accomplish the desired OR-ing functionality as is evident to one skilled in the art. One such alternative embodiment is shown in FIGS. 9A-9C where multi-input NAND gates are shown to provide the control inputs to the "outputting" TSIs.

It is seen from FIG. 7 that for the first group of four even- and four odd-numbered cells (TSIs 57-61 and 89-91)—a total of eight first level of TSIs—only two outputting TSIs 103-104 are activated in the second level and one of each connected to the eCLK 42 and oCLK 43 lines, respectively. These TSIs 103-104 will be deactivated when the second pair of outputting TSIs 105-106 is activated as can be seen from the circuit configuration in FIG. 7. Thus, instead of connecting all TSIs to the eCLK 42 and oCLK 43 lines as in the configuration of FIG. 3, the coarse delay line 34\* configuration in FIG. 7 implements a grouping of TSIs in two hierarchical levels. Each group of TSIs in the "lower" level shares their outputs to the TSIs in the immediately "higher" level. The TSIs at the "highest" hierarchical level (the second level in FIG. 7) will share their outputs and their shared node (the eCLK 42 or oCLK 43 lines) is connected to one input of the phase mixer 36 which interpolates the phase between its two input clocks as discussed hereinbefore. The first level of grouping of TSIs in FIG. 7 (e.g., the TSIs 57-61 and 89-91) results in low junction parasitic load on the eCLK 42 and oCLK 43 inputs to the phase mixer 36 because of substantial reduction in the number of TSIs that are directly connected to the eCLK 42 and oCLK 43 clock lines. The further grouping—at the second level—of TSIs in FIG. 7 (e.g., the TSIs 103-106) facilitate higher frequency operation because of the reduction in the number of TSIs directly connected to the eCLK 42 and oCLK 43 clock lines and, hence, reduction in the junction parasitic load (which allows for operation at higher clock frequencies). By using the hierarchical exit-point delay line structure for the coarse delay line (e.g., the delay line 34\* in FIG. 7) in the synchronization circuit 32 of FIG. 2, a wide clock locking range as well as a seamless phase change in the coarse/fine boundary may be achieved as discussed hereinbefore. A wide locking range may be achieved with the structure 34\* in FIG. 7 because even if many delay cells (CDUs) are used in the coarse delay line to meet long clock period ($t_{CK}$) (lower clock frequency) operation, the presence of large number of delay cells may not hurt short $t_{CK}$ (higher clock frequency) operation because of the smaller junction load achieved at any time by using cell grouping and hierarchical clock exit-point architecture. The low junction parasitic load in the shared node (here, the eCLK 42 and oCLK 43 clock lines inputs to the phase mixer 36) allows for operation at higher clock speeds over 1 GHz.

Figure 8:
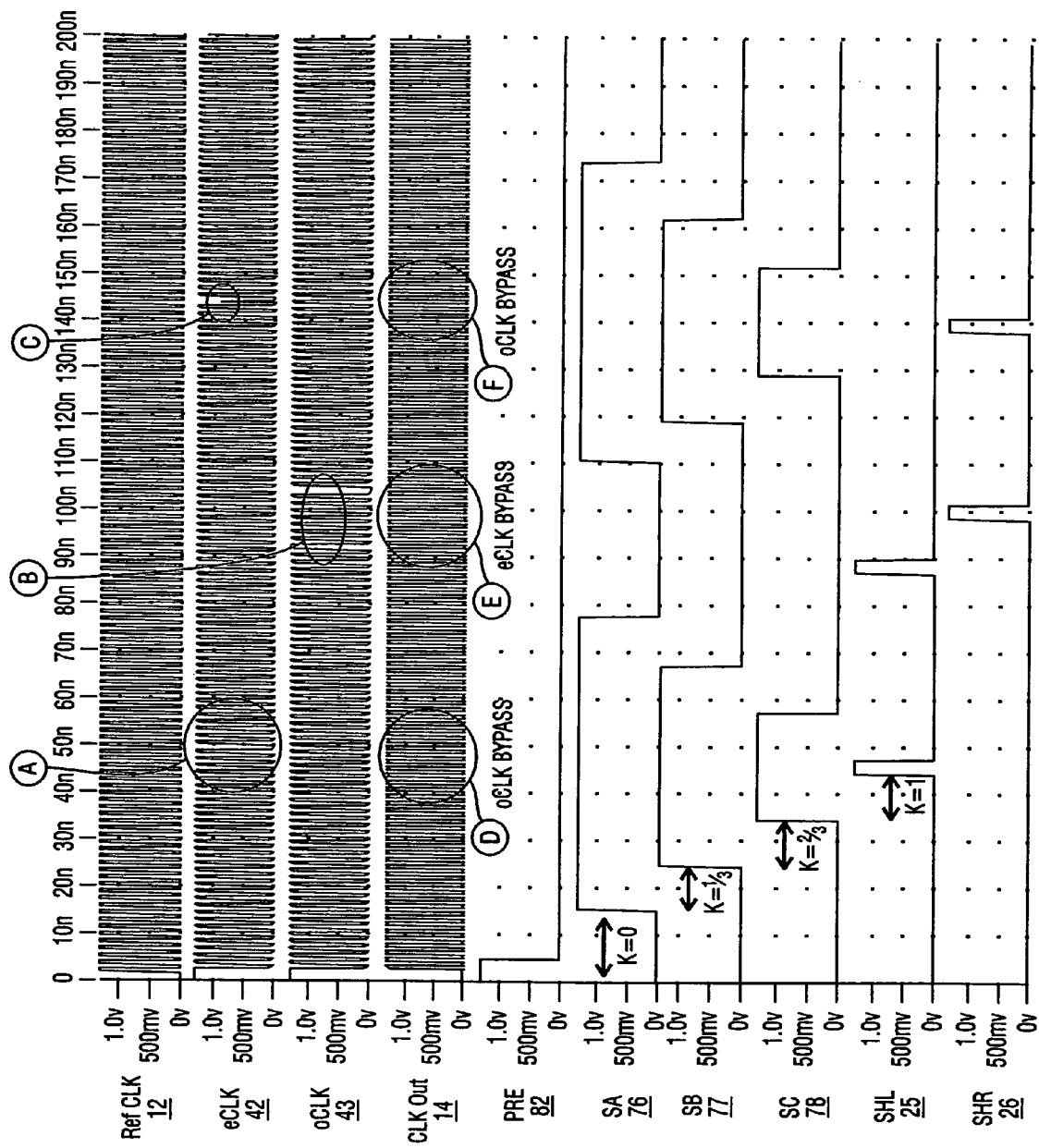
FIG. 8 illustrates another exemplary simulation of various clock and other signals in the synchronization circuit of FIG. 2 and also illustrates the seamless switching (as reflected in the "clean", final output clock) at the coarse-fine boundary using the coarse and fine delay line architecture of FIG. 7.

FIG. 8 illustrates another exemplary simulation of various clock and other signals in the synchronization circuit of FIG. 2 and also illustrates the seamless switching (as reflected in the "clean", final output clock) at the coarse-fine boundary using the coarse and fine delay line architecture of FIG. 7. Various clock and control signals in FIG. 8 are similar to those shown in FIG. 4 and, hence, are identified by the same reference numerals. For example, the SA, SB, and SC signals 76-78, respectively, are shown in FIGS. 4-6 as well as in FIGS. 8-9. As mentioned hereinbefore, these signals 76-78 constitute the weight factor signal 44 (from the control unit 46) carrying the value of weight factor "K." Similarly, the shift left (SHL) and shift right (SHR) signals 25-26 from the phase detector 38 are also shown in FIGS. 4 and 8. It is seen from the simulation waveforms of RefClk 12, eCLK 42, oCLK 43, and ClkOut 14 that although there are some glitches or phase changes occurring during coarse shifting (in the coarse delay line 34\*) as reflected in the waveforms of the intermediate clocks 4243 and as pointed out by the circled letters A, B, and C in FIG. 8, the final output clock (i.e., the ClkOut signal 14) is absent of any jitter or noise caused by such coarse shifting glitches because of the generation of two intermediate clocks 4243 and the weight-factor (K) based phase interpolation performed in the phase mixer 36.

The assertion of SHL 25 and SHR 26 signals (and, hence, assertion of appropriate SEL signals from the shift register 28) may result in such phase changes or jitters in the eCLK 42 and oCLK 43 signals, but the output clock 14 from the phase mixer 36 is independent of such perturbations as shown in FIG. 8. Various exemplary values of the weight factor "K" are also indicated in FIG. 8 for ease of reference. For example, in FIG. 8, the value of weight factor "K" is initially set at K=0, but is gradually increased to K=1 at which point the phase mixer is bypassing the oCLK 43 to its output 14 (as represented by the circled letter D in FIG. 8) and, hence, a glitch in the eCLK 42 (represented by the circled letter A in FIG. 8) does not appear in the final output 14. Thereafter, the value of K may be decreased to a point when K=0, thereby resulting in the eCLK 42 bypass to the output 14 of the phase mixer 36 (as shown by the circled letter E in FIG. 8). Any jitters in the oCLK 43 (as represented by the circled letter B in FIG. 8) when K=0 fail to appear in the output clock 14 because of the occurrence of eCLK bypass (as shown by the circled letter E in FIG. 8). Similarly, the oCLK 43 bypass may again occur when K is again increased to K=1 as indicated by the circled letter F in FIG. 8. The glitch in the eCLK 42 (shown at circled letter C in FIG. 8) thus fails to appear in the final output 14 because of this oCLK bypass. Thus, as noted hereinbefore, the generation of intermediate clocks 42-43 with a fixed phase delay therebetween and a weight-factor based phase interpolation or mixing in the phase mixer 36 results in a seamless transition from coarse delay to fine delay as reflected in the final output clock 14 in FIG. 8.

FIGS. 9A-9C depict a detailed circuit diagram according to one embodiment of the present disclosure for simulation of the clock synchronization circuit of FIG. 2. The circuit schematic in FIGS. 9A-9C is similar to the schematic in FIGS. 6A-6B, except that the coarse delay line 34\* (FIG. 7) is depicted in FIGS. 9A-9C whereas the coarse delay line 34 (FIG. 3) is depicted in FIGS. 6A-6B. The circuit schematic in FIGS. 9A-9C illustrates the shift register 48, the coarse delay line 34\*, and the phase mixer 36 blocks in FIG. 2 in more detail. A few of the signal lines in FIGS. 9A-9C are labeled with reference numerals to provide context with reference to FIGS. 2 and 7. Although neither a discussion of FIGS. 9A-9C nor an exhaustive component labeling is provided herein for various circuit elements in FIGS. 9A-9C, it is noted that the operation of the circuit in FIGS. 9A-9C may be easily understood by one skilled in the art upon comparison with the block diagrams in FIGS. 2 and 7 and based on the earlier discussion of the operation of the DLL 32 in FIG. 2 and the operation of the coarse delay line 34* in FIG. 7. It is observed here that the circuit schematic in FIGS. 9A-9C is for illustrative purpose only. A circuit designer may implement the DLL 32 in FIG. 2 and the coarse delay line 34* in FIG. 7 in many other different ways using the teachings of the present disclosure.

As noted before, the DLL 32 according to one embodiment of the present disclosure is one type of synchronous circuit that can be internal to any integrated circuit including, for example, an SDRAM memory unit. Further, although the discussion given hereinbefore is with reference to a DLL (e.g., the DLL 32), the combination of the coarse delay line 34 (FIG. 3) or 34* (FIG. 7) and the phase mixer 36 architecture in FIGS. 3 and 7 of the present disclosure may be used (with suitable modifications known to one skilled in the art) with any other synchronous circuit including, for example, synchronous mirror delay (SMD) circuits or phase locked loop (PLL) circuits that may also be used for clock synchronization in various electronic integrated circuits including, for example, SDRAMs. The architecture of FIGS. 3 and 7 may be used to accomplish fast locking time without output clock jitter or noise at high input (reference) clock frequencies. The deactivation or turning off of unused delay stages and selective activation of needed delay units and tri-state inverters in the coarse delay line 34 in FIG. 3 or 34* in FIG. 7 further results in lower current and power consumption at higher operating frequencies.

Figure 10:
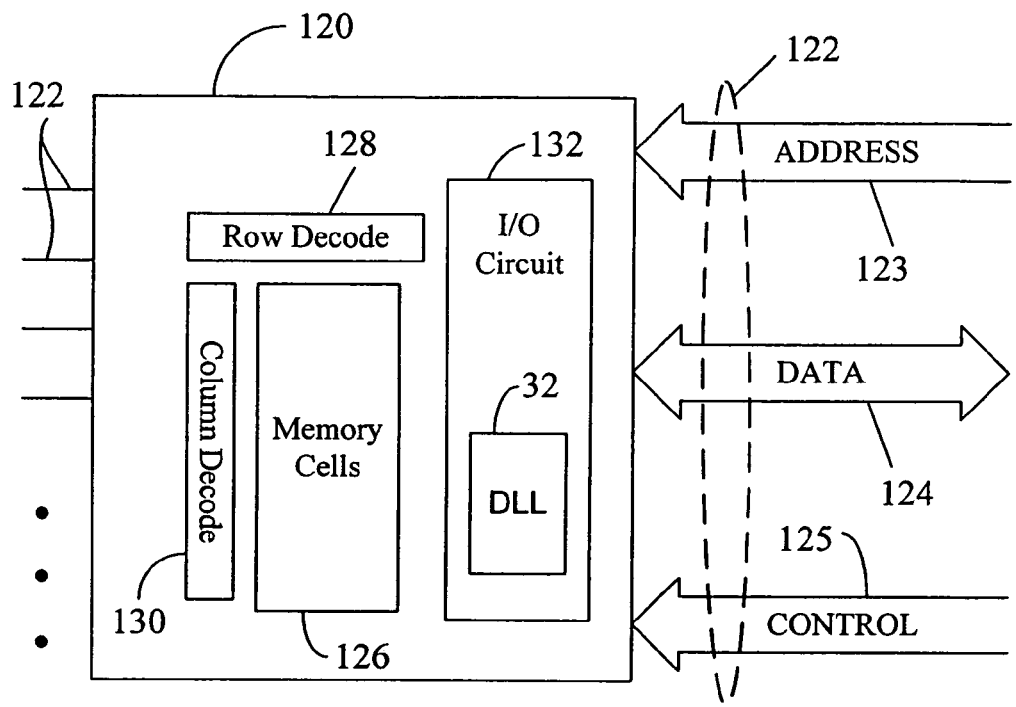
FIG. 10 is a simplified block diagram showing a memory chip or memory device employing the clock synchronization circuit of FIG. 2 according to one embodiment of the present disclosure.

FIG. 10 is a simplified block diagram showing a memory chip or memory device 120 employing the clock synchronization circuit (i.e., the DLL 32) of FIG. 2 according to one embodiment of the present disclosure. The memory chip 120 may be part of a DIMM (dual in-line memory module) or a PCB (printed circuit board) containing many such memory chips (not shown in FIG. 10). The memory chip 120 may include a plurality of pins 122 located outside of chip 120 for electrically connecting the chip 120 to other system devices. Some of those pins 122 may constitute memory address pins or address bus 123, data pins or data bus 124, and control pins or control bus 125. It is evident that each of the reference numerals 123-125 designates more than one pin in the corresponding bus. Further, it is understood that the schematic in FIG. 10 is for illustration only. That is, the pin arrangement or configuration in a typical memory chip may not be in the form shown in FIG. 10.

A processor or memory controller (not shown in FIG. 10, but shown in FIG. 11) may communicate with the chip 120 and perform memory read/write operations. The processor and the memory chip 120 may communicate using address signals on the address lines or address bus 123, data signals on the data lines or data bus 124, and control signals (e.g., a row address strobe (RAS) signal, a column address strobe (CAS) signal, etc. (not shown)) on the control lines or control bus 125. The "width" (i.e., number of pins) of address, data and control buses may differ from one memory configuration to another.

Those of ordinary skill in the art will readily recognize that memory chip 120 of FIG. 10 is simplified to illustrate one embodiment of a memory chip and is not intended to be a detailed illustration of all of the features of a typical memory chip. Numerous peripheral devices or circuits may be typically provided along with the memory chip 120 for writing data to and reading data from the memory cells 126. However, these peripheral devices or circuits are not shown in FIG. 10 for the sake of clarity.

The memory chip 120 may include a plurality of memory cells 126 generally arranged in rows and columns to store data in rows and columns. Each memory cell 126 may store a bit of data. A row decode circuit 128 and a column decode circuit 130 may select the rows and columns in the memory cells 126 in response to decoding an address, provided on the address bus 123. Data to/from the memory cells 126 is then transferred over the data bus 124 via sense amplifiers and a data output path (not shown). A memory controller (not shown) may provide relevant control signals (not shown) on the control bus 125 to control data communication to and from the memory chip 120 via an I/O (input/output) unit 132. The I/O unit 132 may include a number of data output buffers (not shown) to receive the data bits from the memory cells 126 and provide those data bits or data signals to the corresponding data lines in the data bus 124. The I/O unit 132 may further include a clock synchronization unit or delay locked loop (DLL) (e.g., the DLL 32 of FIG. 2) to synchronize the external system clock (e.g., the clock used by the memory controller (not shown) to clock address, data and control signals between the memory chip 120 and the controller) with the internal clock used by the memory 120 to perform data write/read operations on the memory cells 126.

The memory controller (not shown) may determine the modes of operation of memory chip 120. Some examples of the input signals or control signals (not shown in FIG. 10) on the control bus 125 include an External Clock signal, a Chip Select signal, a Row Access Strobe signal, a Column Access Strobe signal, a Write Enable signal, etc. The memory chip 120 communicates to other devices connected thereto via the pins 122 on the chip 120. These pins, as mentioned before, may be connected to appropriate address, data and control lines to carry out data transfer (i.e., data transmission and reception) operations.

Figure 11:
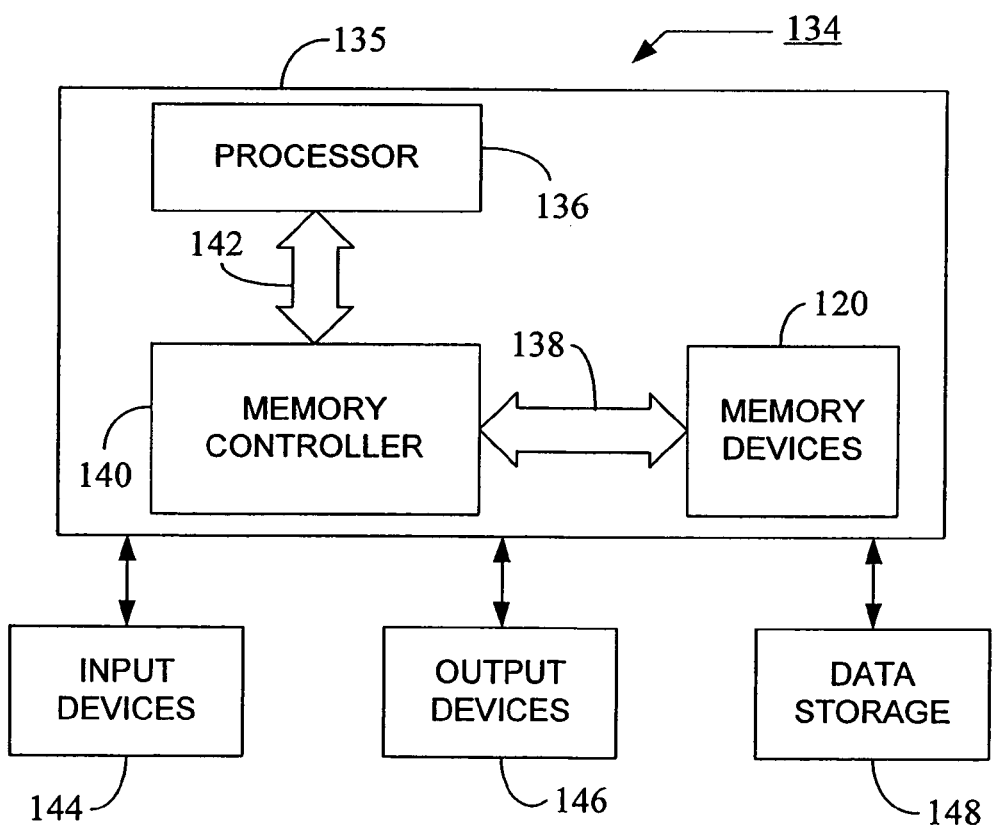
FIG. 11 is a block diagram depicting a system in which one or more memory chips having the architecture shown in FIG. 10 are used.

FIG. 11 is a block diagram depicting a system 134 in which one or more memory chips 120 having the architecture shown in FIG. 10 are used. The system 134 may include a data processing unit or computing unit 135 that includes a processor 136 for performing various computing functions, such as executing specific software to perform specific calculations or data processing tasks. The computing unit 135 may also include memory devices 120 that are in communication with the processor 136 through a bus 138. The bus 138 may include an address bus (not shown), a data bus (not shown), and a control bus (not shown). Each of the memory device 120 can be a dynamic random access memory (DRAM) chip or another type of memory circuits such as SRAM (Static Random Access Memory) chip or Flash memory. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that the memory device 120 of FIGS. 10 and 11 is simplified to illustrate one embodiment of a memory device and is not intended to be a detailed illustration of all of the features of a typical memory chip. The processor 136 can perform a plurality of functions based on information and data stored in the memory devices 120. The processor 136 can be a microprocessor, digital signal processor, embedded processor, micro-controller, dedicated memory test chip, or the like.

Each of the memory devices 120 may have construction similar to that shown in FIG. 10 (i.e., each memory device 120 may include the clock synchronization circuit 32 constructed according to the teachings of the present disclosure), and, hence, the same reference numeral "120" is used in FIGS. 10 and 11 to refer to these memory devices. A memory controller 140 controls data communication to and from the memory devices 120 in response to control signals (not shown) received from the processor 136 over the bus 142. The memory controller 140 may include a command decode circuit (not shown). The command decode circuit may receive the input control signals (on the bus 142) (not shown) to determine the modes of operation of one or more of the memory devices 120. Some examples of the input signals or control signals (not shown in FIG. 11) on the bus 142 (and also on the bus 138) include an External Clock signal, a Chip Select signal, a Row Access Strobe signal, a Column Access Strobe signal, a Write Enable signal, etc.

The system 134 may include one or more input devices 144 (e.g., a keyboard, a mouse, etc.) connected to the computing unit 135 to allow a user to manually input data, instructions, etc., to operate the computing unit 135. One or more output devices 146 connected to the computing unit 135 may also be provided as part of the system 134 to display or otherwise output data generated by the processor 136. Examples of output devices 146 include printers, video terminals or video display units (VDUs). In one embodiment, the system 134 also includes one or more data storage devices 148 connected to the data processing unit 135 to allow the processor 136 to store data in or retrieve data from internal or external storage media (not shown). Examples of typical data storage devices 148 include drives that accept hard and floppy disks, CD-ROMs (compact disk read-only memories), and tape cassettes.

The foregoing describes a clock synchronization system and method to avoid output clock jitter at high frequencies and to also achieve a smooth phase transition at the boundary of the coarse and fine delays. The system may use a single coarse delay line configured to generate two intermediate clocks from the input reference clock and having a fixed phase difference therebetween. The coarse delay line may have a hierarchical or a non-hierarchical structure. A phase mixer receives these two intermediate clocks and generates the final output clock having a phase between the phases of the intermediate clocks. The coarse shifting in the delay line at high clock frequencies does not affect the phase relationship between the intermediate clocks fed into the phase mixer. Thus, the phase mixer receives the intermediate clocks with a fixed phase delay at all times, regardless of coarse shifting performed in the coarse delay line. Therefore, although a phase mixer may solve the delay discontinuity problem between the coarse and fine delay boundary, the generation of the intermediate signals using a single delay line further allows coarse shifting at high frequencies, without any limitations. The output clock from the phase mixer is time synchronized with the input reference clock and does not exhibit any jitters or noise even at high clock frequency inputs.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of producing an output clock, comprising:
    applying a reference clock to a first delay unit in a coarse delay line, wherein said delay line includes a plurality of delay units;
    generating a first intermediate clock and a second intermediate clock from said reference clock using said delay line, wherein said first and said second intermediate clocks have a fixed phase difference therebetween;
    inputting each of said first and second intermediate clocks to a phase mixer through first and second switching levels, wherein said second switching level has fewer switches than said first switching level; and
    generating the output clock from said first and said second intermediate clocks using said phase mixer, wherein said output clock has a phase between the phases of said first and said second intermediate clocks.

2. The method of claim 1 wherein a time value of said fixed phase difference is equal to a time delay provided by at least one of said delay units in said delay line.

3. The method of claim 1 wherein said generating an output clock comprises:
    inputting a weight factor signal to said phase mixer, said phase mixer configured to generate said output clock using said first intermediate clock, said second intermediate clock, and said weight factor signal.

4. The method of claim 3 wherein said phase mixer is configured based on the following equation:

$$\text{said output clock} = (\text{said first intermediate clock})*(1-K) + (\text{said second intermediate clock})*(K),$$

wherein "K" is said weight factor signal.

5. The method of claim 1 wherein generating a first intermediate clock and a second intermediate clock includes serially activating delay units within said delay line, and wherein said inputting through said first switching level includes activating first switching level switches connected to an input and an output of a last delay unit to be activated, and deactivating any other first switching level switches in said first switching level.

6. The method of claim 5 wherein said second switching level is comprised of a second switching level switch responsive to said first switching level, said inputting including:
    producing a first group of signals, each signal operating a corresponding one of said first switching level switches; and
    operating said second level switch with any of said first group of signals.

7. A method of operating a synchronization circuit, comprising:
    applying a reference clock to a first delay unit in a coarse delay line, wherein said delay line includes a plurality of delay units;
    generating a first intermediate clock and a second intermediate clock from said reference clock using said coarse delay line, wherein said first and said second intermediate clocks have a fixed phase difference therebetween;
    inputting each of said first and said second intermediate clocks into a fine delay unit through first and second switching levels, wherein said second switching level has fewer switches than said first switching level;
    generating an output clock from said first and said second intermediate clocks using said fine delay unit, wherein said output clock has a phase between the phases of said first and said second intermediate clocks; and
    using said output clock as a feedback signal to control the number of delay units that are active in said coarse delay line.

8. The method of claim 7 wherein a time value of said fixed phase difference is equal to a time delay provided by at least one of said delay units in said delay line.

9. The method of claim 7 wherein said fine delay unit is a phase mixer and wherein said generating an output clock comprises:
    applying said first and said second intermediate clocks to said phase mixer; and inputting a weight factor signal to said phase mixer, said phase mixer configured to generate said output clock using said first intermediate clock, said second intermediate clock, and said weight factor signal.

10. The method of claim 9 wherein said phase mixer is configured based on the following equation:

said output clock=(said first intermediate clock)*(1−K)+(said second intermediate clock)*(K), wherein "K" is said weight factor signal.

11. The method of claim 7 wherein generating a first intermediate clock and a second intermediate clock includes serially activating delay units within said delay line, and wherein said inputting through said first switching level includes activating first switching level switches connected to an input and an output of a last delay unit to be activated, and deactivating any other first switching level switches in said first level of switches.

12. The method of claim 11 wherein said second switching level is comprised of a second switching level switch responsive to said first switching level, said inputting including:
producing a first group of signals, each signal operating a corresponding one of said first switching level switches; and
operating said second level switch with any of said first group of signals.

13. A circuit, comprising:
a plurality of series connected course delay units for receiving a reference clock and for generating a first intermediate clock and a second intermediate clock therefrom, wherein said first and said second intermediate clocks have a fixed phase difference therebetween;
a hierarchical switching network responsive to said plurality of series connected course delay units; and
a phase mixer coupled to said hierarchical switching network to receive said first and said second intermediate clocks as inputs thereto and to generate an output clock as an output therefrom, wherein said output clock has a phase between the phases of said first and said second intermediate clocks.

14. The circuit of claim 13 wherein a time value of said fixed phase difference is equal to a time delay provided by at least one of said delay units.

15. The circuit of claim 13 wherein said phase mixer is configured to generate said output clock based on the following equation:

said output clock=(said first intermediate clock)*(1−K)+(said second intermediate clock)*(K), wherein "K" is a weight factor signal supplied to said phase mixer.

16. The circuit of claim 13 wherein said hierarchical switching network comprises a plurality of tri-state inverters each connected so as to receive an output from a corresponding one of said delay units, and wherein the outputs of all even-numbered tri-state inverters are connected together and the outputs of all odd-numbered tri-state inverters are connected together.

17. The circuit of claim 13 wherein said hierarchical switching network comprises a first plurality of first level tri-state inverters each connected so as to receive an output from a corresponding one of said delay units, wherein all even-numbered tri-state inverters in said first plurality of first level tri-state inverters are grouped into a first set, and wherein all odd-numbered tri-state inverters in said first plurality of first level tri-state inverters are grouped into a second set; and
wherein said hierarchical switching network additionally comprises a first second level tri-state inverter responsive to said first set and a second second level tri-state inverter responsive to said second set.

18. A synchronization circuit, comprising:
a plurality of series connected course delay units for receiving a reference clock and for generating a first intermediate clock and a second intermediate clock therefrom, wherein said first and said second intermediate clocks have a fixed phase difference therebetween;
a hierarchical switching network responsive to said plurality of series connected course delay units;
a phase mixer coupled to said hierarchical switching network to receive said first and said second intermediate clocks as inputs thereto and to generate an output clock as an output therefrom, wherein said output clock has a phase between the phases of said first and said second intermediate clocks; and
a feedback loop responsive to said output clock and said reference clock for controlling said plurality of series connected course delay units.

19. The circuit of claim 18 wherein a time value of said fixed phase difference is equal to a time delay provided by at least one of said delay units.

20. The circuit of claim 18 wherein said phase mixer is configured to generate said output clock based on the following equation:

said output clock=(said first intermediate clock)*(1−K)+(said second intermediate clock)*(K), wherein "K" is a weight factor signal supplied to said phase mixer.

21. The circuit of claim 18 wherein said hierarchical switching network comprises a plurality of tri-state inverters each connected so as to receive an output from a corresponding one of said delay units, and wherein the outputs of all even-numbered tri-state inverters are connected together and the outputs of all odd-numbered tri-state inverters are connected together.

22. The circuit of claim 18 wherein said hierarchical switching network comprises a first plurality of first level tri-state inverters each connected so as to receive an output from a corresponding one of said delay units, wherein all even-numbered tri-state inverters in said first plurality of first level tri-state inverters are grouped into a first set, and wherein all odd-numbered tri-state inverters in said first plurality of first level tri-state inverters are grouped into a second set; and
wherein said hierarchical switching network additionally comprises a first second level tri-state inverter responsive to said first set and a second second level tri-state inverter responsive to said second set.

23. The circuit of claim 18 wherein said feedback loop comprises:
a phase detector for receiving said reference clock and said output clock and for generating a shift indication signal based on a relationship between the phases of said reference clock and said output clock; and
a shift register coupled to said plurality of series connected course delay units and said phase detector, wherein said shift register generates and outputs a shift selection signal to said plurality of series connected course delay units based on said shift indication signal to thereby control the number of delay units that are active.

24. The circuit of claim 23 further comprising a control unit responsive to said phase detector for producing a weight factor signal.

25. The circuit of claim 18 wherein said phase mixer comprises:
- a first set of tri-state inverters, wherein each tri-state inverter in said first set is configured to receive said first intermediate clock as an input thereto and wherein each tri-state inverter in said first set is configured to receive a corresponding weight factor signal to be applied to said first intermediate clock; and
- a second set of tri-state inverters, wherein each tri-state inverter in said second set is configured to receive said second intermediate clock as an input thereto and wherein each tri-state inverter in said second set is configured to receive said corresponding weight factor signal in a manner complementary to that for a similarly-situated tri-state inverter in said first set of tri-state inverters, and wherein outputs of all tri-state inverters in said first set and said second set of tri-state inverters are connected together to obtain said output clock.

26. A memory device, comprising:
- a plurality of memory cells; and
- a plurality of peripheral devices for writing data to and reading data from said plurality of memory cells, said peripheral devices including a synchronization circuit comprising:
  - a plurality of series connected course delay units for receiving a reference clock and for generating a first intermediate clock and a second intermediate clock therefrom, wherein said first and said second intermediate clocks have a fixed phase difference therebetween;
  - a hierarchical switching network responsive to said plurality of series connected course delay units;
  - a phase mixer coupled to said hierarchical switching network to receive said first and said second intermediate clocks as inputs thereto and to generate an output clock as an output therefrom, wherein said output clock has a phase between the phases of said first and said second intermediate clocks; and
  - a feedback loop responsive to said output clock and said reference clock for controlling said plurality of series connected course delay units.

27. The memory device of claim 26 wherein a time value of said fixed phase difference is equal to a time delay provided by at least one of said delay units.

28. The memory device of claim 26 wherein said phase mixer is configured to generate said output clock based on the following equation:

$$\text{said output clock} = (\text{said first intermediate clock})*(1-K) + (\text{said second intermediate clock})*(K),$$

wherein "K" is a weight factor signal supplied to said phase mixer.

29. The memory device of claim 26 wherein said feedback loop comprises:
- a phase detector for receiving said reference clock and said output clock and for generating a shift indication signal based on a relationship between the phases of said reference clock and said output clock; and
- a shift register coupled to said plurality of series connected course delay units and said phase detector, wherein said shift register generates and outputs a shift selection signal to said plurality of series connected course delay units based on said shift indication signal to thereby control the number of delay units that are active.

30. The memory device of claim 29 further comprising a control unit responsive to said phase detector for producing a weight factor signal.

31. The memory device of claim 26 wherein said phase mixer comprises:
- a first set of tri-state inverters, wherein each tri-state inverter in said first set is configured to receive said first intermediate clock as an input thereto and wherein each tri-state inverter in said first set is configured to receive a corresponding weight factor signal to be applied to said first intermediate clock; and
- a second set of tri-state inverters, wherein each tri-state inverter in said second set is configured to receive said second intermediate clock as an input thereto and wherein each tri-state inverter in said second set is configured to receive said corresponding weight factor signal in a manner complementary to that for a similarly-situated tri-state inverter in said first set of tri-state inverters, and wherein outputs of all tri-state inverters in said first set and said second set of tri-state inverters are connected together to obtain said output clock.

32. The memory device of claim 26 wherein said hierarchical switching network comprises a first plurality of first level tri-state inverters each connected so as to receive an output from a corresponding one of said delay units, wherein all even-numbered tri-state inverters in said first plurality of first level tri-state inverters are grouped into a first set; and
- wherein all odd-numbered tri-state inverters in said first plurality of first level tri-state inverters are grouped into a second set; and
- wherein said hierarchical switching network additionally comprises a first second level tri-state inverter responsive to said first set and a second second level tri-state inverter responsive to said second set.

33. A system, comprising:
- a processor;
- a bus; and
- a memory device coupled to said processor via said bus, wherein said memory device comprises a plurality of memory cells and a plurality of peripheral devices for writing data to and reading data from said plurality of memory cells, said peripheral devices including a synchronization circuit comprising:
  - a plurality of series connected course delay units for receiving a reference clock and for generating a first intermediate clock and a second intermediate clock therefrom, wherein said first and said second intermediate clocks have a fixed phase difference therebetween;
  - a hierarchical switching network responsive to said plurality of series connected course delay units;
  - a phase mixer coupled to said hierarchical switching network to receive said first and said second intermediate clocks as inputs thereto and to generate an output clock as an output therefrom, wherein said output clock has a phase between the phases of said first and said second intermediate clocks; and
  - a feedback loop responsive to said output clock and said reference clock for controlling said plurality of series connected course delay units.

34. The system of claim 33 wherein a time value of said fixed phase difference is equal to a time delay provided by at least one of said delay units.

35. The system of claim 33 wherein said phase mixer is configured to generate said output clock based on the following equation:

$$\text{said output clock} = (\text{said first intermediate clock})*(1-K) + (\text{said second intermediate clock})*(K),$$

wherein "K" is a weight factor signal supplied to said phase mixer.

36. The system of claim 33 wherein said feedback loop comprises:
a phase detector for receiving said reference clock and said output clock and for generating a shift indication signal based on a relationship between the phases of said reference clock and said output clock; and
a shift register coupled to said plurality of series connected course delay units and said phase detector, wherein said shift register generates and outputs a shift selection signal to said plurality of series connected course delay units based on said shift indication signal to thereby control the number of delay units that are active.

37. The system of claim 36 further comprising a control unit responsive to said phase detector for producing a weight factor signal.

38. The system of claim 33 wherein said phase mixer comprises:
a first set of tri-state inverters, wherein each tri-state inverter in said first set is configured to receive said first intermediate clock as an input thereto and wherein each tri-state inverter in said first set is configured to receive a corresponding weight factor signal to be applied to said first intermediate clock; and
a second set of tri-state inverters, wherein each tri-state inverter in said second set is configured to receive said second intermediate clock as an input thereto and wherein each tri-state inverter in said second set is configured to receive said corresponding weight factor signal in a manner complementary to that for a similarly-situated tri-state inverter in said first set of tri-state inverters, and wherein outputs of all tri-state inverters in said first set and said second set of tri-state inverters are connected together to obtain said output clock.

39. The system of claim 33 wherein said hierarchical switching network comprises a first plurality of first level tri-state inverters each connected so as to receive an output from a corresponding one of said delay units, wherein all even-numbered tri-state inverters in said first plurality of first level tri-state inverters are grouped into a first set, and
wherein all odd-numbered tri-state inverters in said first plurality of first level tri-state inverters are grouped into a second set; and
wherein said hierarchical switching network additionally comprises a first second level tri-state inverter responsive to said first set and a second second level tri-state inverter responsive to said second set.

40. A circuit, comprising:
a single, coarse delay line for receiving a reference clock and for generating a first intermediate clock and a second intermediate clock therefrom, wherein said first and said second intermediate clocks have a fixed phase difference therebetween; and
a phase mixer coupled to said delay line to receive said first and said second intermediate clocks as inputs thereto and to generate an output clock as an output therefrom, wherein said output clock has a phase between the phases of said first and said second intermediate clocks;
said delay line comprising:
a plurality of delay units forming a serial chain of delay units, and wherein said reference clock is applied to a first delay unit in said chain of delay units; and
a first plurality of tri-state inverters each placed so as to receive an output from a corresponding one of said delay units in said chain of delay units, wherein all even-numbered tri-state inverters in said first plurality of tri-state inverters are grouped into a plurality of first sets, wherein each of said plurality of first sets contains a predetermined number of even-numbered tri-state inverters, and wherein all odd-numbered tri-state inverters in said first plurality of tri-state inverters are grouped into a plurality of second sets, wherein each of said plurality of second sets contains a predetermined number of odd-numbered tri-state inverters;
a plurality of first set signal output lines, wherein each first set signal output line is obtained from combining outputs of all even-numbered tri-state inverters in each corresponding first set;
a plurality of second set signal output lines, wherein each second set signal output line is obtained from combining outputs of all odd-numbered tri-state inverters in each corresponding second set; and
a second plurality of tri-state inverters comprising a plurality of even-numbered outputting tri-state inverters and a plurality of odd-numbered outputting tri-state inverters, wherein an input of each even-numbered outputting tri-state inverter is connected to a corresponding one of said plurality of first set signal output lines and an input of each odd-numbered outputting tri-state inverter is connected to a corresponding one of said plurality of second set signal output lines, wherein the outputs of all even-numbered outputting tri-state inverters are connected together to obtain said first intermediate clock and the outputs of all odd-numbered outputting tri-state inverters are connected together to obtain said second intermediate clock.

41. A synchronization circuit, comprising:
a single, coarse delay line for receiving a reference clock and for generating a first intermediate clock and a second intermediate clock therefrom, wherein said first and said second intermediate clocks have a fixed phase difference therebetween;
a phase mixer coupled to said delay line to receive said first and said second intermediate clocks as inputs thereto and to generate an output clock as an output therefrom, wherein said output clock has a phase between the phases of said first and said second intermediate clocks; and
a feedback loop for controlling said coarse delay line;
wherein said coarse delay line comprises:
a plurality of delay units forming a serial chain of delay units, and wherein said reference clock is applied to a first delay unit in said chain of delay units; and
a first plurality of tri-state inverters each placed so as to receive an output from a corresponding one of said delay units in said chain of delay units, wherein all even-numbered tri-state inverters in said first plurality of tri-state inverters are grouped into a plurality of first sets, wherein each of said plurality of first sets contains a predetermined number of even-numbered tri-state inverters, and wherein all odd-numbered tri-state inverters in said first plurality of tri-state inverters are grouped into a plurality of second sets, wherein each of said plurality of second sets contains a predetermined number of odd-numbered tri-state inverters;
a plurality of first set signal output lines, wherein each first set signal output line is obtained from combining outputs of all even-numbered tri-state inverters in each corresponding first set;
a plurality of second set signal output lines, wherein each second set signal output line is obtained from combining outputs of all odd-numbered tri-state inverters in each corresponding second set; and a second plurality of tri-state inverters comprising a plurality of even-numbered outputting tri-state inverters and a plurality of odd-numbered outputting tri-state inverters, wherein an input of each even-numbered outputting tri-state inverter is connected to a corresponding one of said plurality of first set signal output lines and an input of each odd-numbered outputting tri-state inverter is connected to a corresponding one of said plurality of second set signal output lines, wherein the outputs of all even-numbered outputting tri-state inverters are connected together to obtain said first intermediate clock and the outputs of all odd-numbered outputting tri-state inverters are connected together to obtain said second intermediate clock.

42. A memory device, comprising:

a plurality of memory cells; and a plurality of peripheral devices for writing data to and reading data from said plurality of memory cells, said peripheral devices including a synchronization circuit comprising:

a single, coarse delay line for receiving a reference clock and for generating a first intermediate clock and a second intermediate clock therefrom, wherein said first and said second intermediate clocks have a fixed phase difference therebetween;

a phase mixer coupled to said delay line to receive said first and said second intermediate clocks as inputs thereto and to generate an output clock as an output therefrom, wherein said output clock has a phase between the phases of said first and said second intermediate clocks; and a feedback loop for controlling said coarse delay line;

wherein said coarse delay line comprises:

a plurality of delay units forming a serial chain of delay units, and wherein said reference clock is applied to a first delay unit in said chain of delay units; and a first plurality of tri-state inverters each placed so as to receive an output from a corresponding one of said delay units in said chain of delay units, wherein all even-numbered tri-state inverters in said first plurality of tri-state inverters are grouped into a plurality of first sets, wherein each of said plurality of first sets contains a predetermined number of even-numbered tri-state inverters, and wherein all odd-numbered tri-state inverters in said first plurality of tri-state state inverters are grouped into a plurality of second sets, wherein each of said plurality of second sets contains a predetermined number of odd-numbered tri-state inverters;

a plurality of first set signal output lines, wherein each first set signal output line is obtained from combining outputs of all even-numbered tri-state inverters in each corresponding first set;

a plurality of second set signal output lines, wherein each second set signal output line is obtained from combining outputs of all odd-numbered tri-state inverters in each corresponding second set; and a second plurality of tri-state inverters comprising a plurality of even-numbered outputting tri-state inverters and a plurality of odd-numbered outputting tri-state inverters, wherein an input of each even-numbered outputting tri-state inverter is connected to a corresponding one of said plurality of first set signal output lines and an input of each odd-numbered outputting tri-state inverter is connected to a corresponding one of said plurality of second set signal output lines, wherein the outputs of all even-numbered outputting tri-state inverters are connected together to obtain said first intermediate clock and the outputs of all odd-numbered outputting tri-state inverters are connected together to obtain said second intermediate clock.

43. A system, comprising:

a processor;

a bus; and a memory device coupled to said processor via said bus, wherein said memory device comprises a plurality of memory cells and a plurality of peripheral devices for writing data to and reading data from said plurality of memory cells, said peripheral devices including a synchronization circuit comprising:

a single, coarse delay line for receiving a reference clock and for generating a first intermediate clock and a second intermediate clock therefrom, wherein said first and said second intermediate clocks have a fixed phase difference therebetween;

a phase mixer coupled to said delay line to receive said first and said second intermediate clocks as inputs thereto and to generate an output clock as an output therefrom, wherein said output clock has a phase between the phases of said first and said second intermediate clocks; and a feedback loop for controlling said coarse delay line;

wherein said coarse delay line comprises:

a plurality of delay units forming a serial chain of delay units, and wherein said reference clock is applied to a first delay unit in said chain of delay units; and a first plurality of tri-state inverters each placed so as to receive an output from a corresponding one of said delay units in said chain of delay units, wherein all even-numbered tri-state inverters in said first plurality of tri-state inverters are grouped into a plurality of first sets, wherein each of said plurality of first sets contains a predetermined number of even-numbered tri-state inverters, and wherein all odd-numbered tri-state inverters in said first plurality of tri-state inverters are grouped into a plurality of second sets, wherein each of said plurality of second sets contains a predetermined number of odd-numbered tri-state inverters;

a plurality of first set signal output lines, wherein each first set signal output line is obtained from combining outputs of all even-numbered tri-state inverters in each corresponding first set;

a plurality of second set signal output lines, wherein each second set signal output line is obtained from combining outputs of all odd-numbered tri-state inverters in each corresponding second set; and a second plurality of tri-state inverters comprising a plurality of even-numbered outputting tri-state inverters and a plurality of odd-numbered outputting tri-state inverters, wherein an input of each even-numbered outputting tri-state inverter is connected to a corresponding one of said plurality of first set signal output lines and an input of each odd-numbered outputting tri-state inverter is connected to a corresponding one of said plurality of second set signal output lines, wherein the outputs of all even-numbered outputting tri-state inverters are connected together to obtain said first intermediate clock and the outputs of all odd-numbered outputting tri-state inverters are connected together to obtain said second intermediate clock.

* * * * *

UNITED STATES PATENT AND TRADEMARK OFFICE
CERTIFICATE OF CORRECTION

PATENT NO.         : 7,629,819 B2                                                        Page 1 of 1
APPLICATION NO.    : 11/186548
DATED              : December 8, 2009
INVENTOR(S)        : Jongtae Kwak et al.

It is certified that error appears in the above-identified patent and that said Letters Patent is hereby corrected as shown below:

In column 27, line 45, in Claim 42, before "inverters" delete "state".

Signed and Sealed this

Sixteenth Day of February, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,629,819 B2 | Page 1 of 1 |
| APPLICATION NO. | : 11/186548 | |
| DATED | : December 8, 2009 | |
| INVENTOR(S) | : Kwak et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 377 days.

Signed and Sealed this

Second Day of November, 2010

David J. Kappos
*Director of the United States Patent and Trademark Office*